(12) United States Patent
Inoue

(10) Patent No.: US 6,849,553 B2
(45) Date of Patent: Feb. 1, 2005

(54) METHOD OF MANUFACTURING SEMICONDUCTOR DEVICE

(75) Inventor: Susumu Inoue, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 114 days.

(21) Appl. No.: 10/339,558

(22) Filed: Jan. 10, 2003

(65) Prior Publication Data

US 2003/0190805 A1 Oct. 9, 2003

(30) Foreign Application Priority Data

Jan. 24, 2002 (JP) ........................................ 2002-015390

(51) Int. Cl.$^7$ .................... H01L 21/336; H01L 21/4763
(52) U.S. Cl. ...................... 438/694; 438/258; 438/266; 438/595
(58) Field of Search ............................... 438/258, 267, 438/211, 954, 201, 266, 304, 595, 596

(56) References Cited

U.S. PATENT DOCUMENTS

| | | | |
|---|---|---|---|
| 5,408,115 A | | 4/1995 | Chang |
| 5,422,504 A | * | 6/1995 | Chang et al. .......... 365/185.15 |
| 5,494,838 A | | 2/1996 | Chang et al. |
| 5,663,923 A | | 9/1997 | Baltar et al. |
| 5,969,383 A | | 10/1999 | Chang et al. |
| 6,177,318 B1 | * | 1/2001 | Ogura et al. ................ 438/267 |
| 6,248,633 B1 | * | 6/2001 | Ogura et al. ................ 438/267 |
| 6,255,166 B1 | * | 7/2001 | Ogura et al. ................ 438/257 |
| 6,396,158 B1 | * | 5/2002 | Travis et al. ................ 257/784 |
| 6,413,821 B1 | * | 7/2002 | Ebina et al. ................ 438/257 |
| 6,531,350 B2 | * | 3/2003 | Satoh et al. ................ 438/197 |
| 6,566,196 B1 | * | 5/2003 | Haselden et al. ........... 438/257 |
| 6,599,801 B1 | * | 7/2003 | Chang et al. ................ 438/257 |
| 6,656,794 B2 | * | 12/2003 | Shibata ....................... 438/258 |
| 6,762,092 B2 | * | 7/2004 | Yuan et al. .................. 438/257 |
| 2003/0003661 A1 | * | 1/2003 | Lee ............................. 438/258 |
| 2003/0157767 A1 | | 8/2003 | Kasuya |
| 2003/0166320 A1 | | 9/2003 | Kasuya |
| 2003/0166321 A1 | | 9/2003 | Kasuya |
| 2003/0166322 A1 | | 9/2003 | Kasuya |
| 2003/0186505 A1 | | 10/2003 | Shibata |
| 2003/0211691 A1 | | 11/2003 | Ueda |

FOREIGN PATENT DOCUMENTS

| | | |
|---|---|---|
| JP | A 7-161851 | 6/1995 |
| JP | 11-162981 | 6/1999 |
| JP | B1 2978477 | 9/1999 |
| JP | 11-289015 | 10/1999 |
| JP | 2001-148434 | 5/2001 |
| JP | A 2001-156188 | 6/2001 |
| JP | 2001-156275 | 6/2001 |

OTHER PUBLICATIONS

U.S. patent application Ser. No. 10/636,562, Inoue, filed Aug. 8, 2003.

(List continued on next page.)

*Primary Examiner*—Matthew Smith
*Assistant Examiner*—Chuong Anh Luu
(74) *Attorney, Agent, or Firm*—Oliff & Berridge, PLC

(57) ABSTRACT

The manufacturing method of the present invention forms a patterned gate layer 140d as a dummy circuit on a peripheral portion of a chip 900 simultaneously with formation of a patterned gate layer 140a in a memory area 1000, prior to formation of an insulating layer 270 over whole surface of a semiconductor substrate. This causes appearance of a new protrusion on the top surface of the insulating layer 270 in the peripheral portion of the chip 900. The insulating layer 270 is subsequently polished by chemical mechanical polishing (CMP) technique. The presence of the new protrusion on the top surface of the insulating layer 270 effectively reduces the polishing rate and thereby decreases the polishing degree on the peripheral portion of the chip 900. The technique of the present invention thus preferably prevents exposure of gate electrodes 142 on a part of the chip 900 close to a scribing area 3000 between adjoining chips 900 (that is, on the peripheral portion of the chip 900) in the process of polishing the insulating layer 270.

10 Claims, 20 Drawing Sheets

OTHER PUBLICATIONS

U.S. patent application Ser. No. 10/636,581, Yamamukai, filed Aug. 8, 2003.
U.S. patent application Ser. No. 10/636,582, Inoue, filed Aug. 8, 2003.
U.S. patent application Ser. No. 10/614,985, Inoue, filed Jul. 9, 2003.
U.S. patent application Ser. No. 10/689,993, Kasuya, filed Oct. 22, 2003.
U.S. patent application Ser. No. 10/689,990, Kasuya, filed Oct. 22, 2003.
U.S. patent application Ser. No. 10/689,987, Kasuya, filed Oct. 22, 2003.
U.S. patent application Ser. No. 10/690,025, Kasuya, filed Oct. 22, 2003.
U.S. patent application Ser. No. 10/052,549, Ebina et al., filed Jan. 23, 2002.
U.S. patent application Ser. No. 10/052,255, Ebina et al. filed Jan. 23, 2002.
U.S. patent application Ser. No. 09/953,856, Ebina et al., filed Sep. 18, 2001.
U.S. patent application Ser. No. 09/953,855, Ebina et al., filed Sep. 18, 2001.
U.S. patent application Ser. No. 10/234,095, Ebina et al., filed Sep. 5, 2002.
U.S. patent application Ser. No. 10/244,627, Ebina et al., filed Sep. 17, 2002.
U.S. patent application Ser. No. 10/234,197, Ebina et al., filed Sep. 5, 2002.
U.S. patent application Ser. No. 10/244,623, Ebina et al., filed Sep. 17, 2002.
Yutaka Hayashi et al.; " Twin MONOS Cell with Dual Control Gates"; 2000, IEEE VLSI Technology Digest of Technical Papers; 2000.
Kuo–Tung Chang et al. " A New Sonos Memory Using Source–Side Injection for Programming";IEEE Electron Device Letters, vol. 19, No. 7, Jul. 1998 pp 253–255.
Wei–Ming Chen et al., A Novel Flash Memory Device with S Plit Gate Source Side Injection and ONO Charge Storage Stack (SPIN); VLSI Technology Digest of Technical Papers; 1997 pp 63–34.

* cited by examiner

METHOD OF MANUFACTURING SEMICONDUCTOR DEVICE

BACKGROUND OF THE INVENTION

1. Field of the Invention

The present invention relates to a method of manufacturing a semiconductor device including a memory area and a logic circuit area. More specifically the invention pertains to a method of manufacturing a semiconductor device, on which each of non-volatile memory devices formed in the memory area has two charge accumulation regions relative to one word gate.

2. Description of the Related Art

A semiconductor device is constructed by a chip, on which a memory area including memory cells and a logic circuit area including peripheral circuits of memories are mainly formed. The memory area is generally arranged on a central portion of the chip, and the logic circuit area is arranged on a peripheral portion of the chip to surround the memory area.

Chips are arranged in a grid on a semiconductor wafer (semiconductor substrate). There is a scribing area between adjoining chips. The scribing area represents a region of scratch marks on the surface of the wafer, which is used to divide the wafer into the respective chips.

One type of non-volatile semiconductor memory devices is MONOS (Metal Oxide Nitride Oxide Semiconductor) or SONOS (Silicon Oxide Nitride Oxide Silicon), in which a gate insulating layer between a channel area and a control gate is a multi-layered body of a silicon oxide layer and a silicon nitride layer and charges are trapped by the nitride silicon layer.

FIG. 31 shows a known MONOS non-volatile semiconductor memory device (refer to: Y. Hayashi, et al., 2000 Symposium on VLSI Technology Digest of Technical Papers p.122–123).

Each MONOS memory cell 100 has a word gate 14, which is formed in a memory area on a semiconductor substrate 10 via a first gate insulating layer 12. A first control gate 20 and a second control gate 30 are formed as side walls on both sides of the word gate 14. A second gate insulating layer 22 is present between the bottom of the first control gate 20 and the semiconductor substrate 10. An insulating layer 24 is present between the side face of the first control gate 20 and the word gate 14. Similarly the second gate insulating layer 22 is present between the bottom of the second control gate 30 and the semiconductor substrate 10. The insulating layer 24 is present between the side wall of the second control gate 30 and the word gate 14. Impurity layers 16 and 18, each of which constitutes either a source area or a drain area, are formed in the semiconductor substrate 10 to be located between the control gate 20 and the control gate 30 of adjoining memory cells.

Each memory cell 100 accordingly has two MONOS memory elements on the side faces of the word gate 14. These two MONOS memory elements are controlled independently. Namely each memory cell 100 is capable of storing 2-bit information.

A memory area including such MONOS memory cells and a logic circuit area including peripheral circuits of memories are formed on an identical chip. A prior art method of manufacturing such a chip first forms memory cells in the memory area and subsequently forms peripheral circuits in the logic circuit area. The manufacturing method forms diverse wiring layers via an insulating layer, after formation of the memory area and the logic circuit area.

The manufacturing method forms an insulating layer of, for example, silicon oxide, on the whole surface of the chip and polishes the insulating layer by CMP (chemical mechanical polishing) technique. The polishing is carried out until exposure of stopper layers under the insulating layer in the memory area.

When the insulating layer is formed over the whole surface of the semiconductor substrate, the protrusions appear on the top surface of the insulating layer in the memory area and the logic circuit area on the chip, corresponding to the gate layers and the gate electrodes below the insulating layer. There is no gate layer nor gate electrode, on the other hand, in a scribing area between adjoining chips. Namely the scribing area does not have such protrusions. There is accordingly a variation in polishing rate of the insulating layer. The insulating layer in the scribing area between adjoining chips is polished faster and thereby to a greater degree than the insulating layer in the memory area and the logic circuit area on the chip. A part of the chip close to the scribing area, that is, a peripheral portion of the chip, may thus be polished excessively.

The peripheral portion of the chip is the logic circuit area, as described above. When gate electrodes are present in such an excessively polished portion, the gate electrodes in the logic circuit area may be exposed, prior to exposure of the stopper layers in the memory area, in the process of polishing the insulating layer.

The suicide layer has been formed on the gate electrodes in the precedent process. Exposure of the gate electrodes in the logic circuit area may cause the suicide layer to be polished and contaminate a CMP apparatus used for polishing the insulating layer with metals. The exposed gate electrodes may be etched out in the subsequent process of patterning and forming the word lines by etching.

SUMMARY OF THE INVENTION

The object of the present invention is thus to provide a manufacturing method of a semiconductor device, which prevents exposure of gate electrodes on a part of a chip close to a scribing area (that is, on a peripheral portion of a chip).

In order to attain at least part of the above and other related objects, the present invention is directed to a method of manufacturing a semiconductor device, which includes a memory area having a non-volatile memory device and a logic circuit area including a peripheral circuit of the non-volatile memory device formed on a chip. The manufacturing method includes the steps of: (a) providing a semiconductor substrate, which includes a semiconductor layer, a first insulating layer formed on the semiconductor layer, a first conductive layer formed on the first insulating layer, and a stopper layer formed on the first conductive layer; (b) patterning the stopper layer and the first conductive layer in the memory area on the chip; (c) forming control gates as side walls on both side faces of the patterned first conductive layer via an oxide nitride oxide (ONO) membrane in the memory area on the chip; (d) etching out the stopper layer in the logic circuit area on the chip; (e) patterning the first conductive layer in the logic circuit area on the chip to form a gate electrode of an insulated gate field effect transistor; (f) forming a second insulating layer over whole surface of the semiconductor substrate; and (g) polishing the second insulating layer to expose the stopper layer in the memory area. The manufacturing method further includes the step of: (h) patterning at least the first conductive layer on a peripheral portion of the chip or in a scribing area between adjoining chips to form a gate layer as a dummy circuit. Here the step (h) is carried out prior to the step (f).

The manufacturing method of the invention patterns the first conductive layer on the peripheral portion of the chip or in the scribing area between adjoining chips to form a gate layer as a dummy circuit, prior to formation of the second insulating layer over the whole surface of the semiconductor substrate. This causes appearance of a new protrusion on the top surface of the second insulating layer on the peripheral portion of the chip or in the scribing area between adjoining chips.

In the manufacturing method of the invention, formation of the gate layer as the dummy circuit causes appearance of the new protrusion on the peripheral portion of the chip or in the scribing area between adjoining chips. The presence of the new protrusion effectively reduces the polishing rate and thereby decreases the polishing degree on the peripheral portion of the chip or in the scribing area between adjoining chips. This preferably prevents the peripheral portion of the chip from being polished excessively.

This arrangement effectively prevents exposure of the gate electrode in the logic circuit area on the peripheral portion of the chip, prior to exposure of the stopper layer in the memory area, in the process of polishing the second insulating layer.

In one preferable application of the manufacturing method of the present invention, the step (b) includes the step (h).

This application patterns at least the first conductive layer to form the gate layer as the dummy circuit on the peripheral portion of the chip or in the scribing area between adjoining chips, simultaneously with patterning of the stopper layer and the first conductive layer in the memory area on the chip. Such simultaneous formation desirably simplifies the manufacturing procedure.

In another preferable application of the manufacturing method of the present invention, the step (e) includes the step (h).

This application patterns at least the first conductive layer to form the gate layer as the dummy circuit on the peripheral portion of the chip or in the scribing area between adjoining chips, simultaneously with patterning of the first conductive layer in the logic circuit area on the chip to form the gate electrode of the insulated gate field effect transistor. Such simultaneous formation desirably simplifies the manufacturing procedure.

In one preferable embodiment of the manufacturing method of the invention, the step (c) includes the sub-steps of: (c-1) forming the ONO membrane in at least the memory area; (c-2) forming a second conductive layer on the ONO membrane; and (c-3) etching the second conductive layer to form the control gates of the second conductive layer via the ONO membrane on both the side faces of the patterned first conductive layer in the memory area.

These sub-steps enable the control gates to be formed as side walls via the ONO membrane on both side face of the patterned first conductive layer.

In the manufacturing method of the invention, it is preferable that the step (g) applies chemical mechanical polishing (CMP) technique to polish the second insulating layer.

The CMP technique is suitable for leveling off the interlayer insulating layer over the whole surface of the semiconductor substrate.

The above and other objects, features, aspects, and advantages of the present invention will become more apparent from the following detailed description of the preferred embodiment with the accompanying drawings.

DESCRIPTION OF THE PREFERRED EMBODIMENTS

Figure 1:
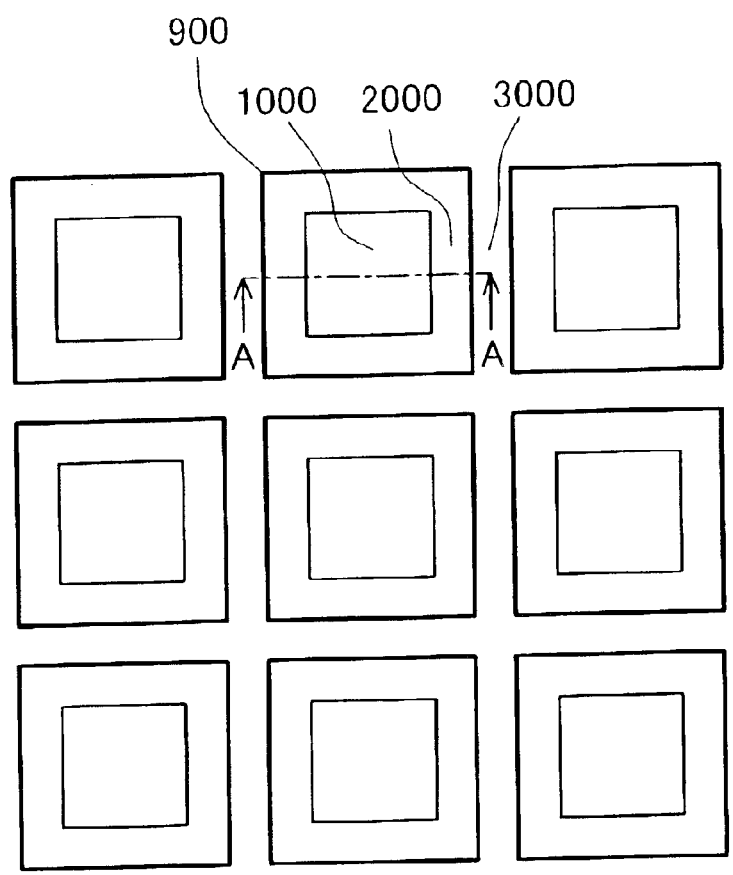
FIG. 1 is a plan view showing an array of chips, which construct a semiconductor device manufactured by a manufacturing method in one embodiment of the present invention.

FIG. 1 is a plan view showing an array of chips, which construct a semiconductor device manufactured by a manufacturing method in one embodiment of the present invention.

The semiconductor device of this embodiment is constructed by chips 900. The respective chips 900 are arranged in a grid on a semiconductor wafer (semiconductor substrate) as shown in FIG. 1. There is a scribing area 3000 between adjoining chips 900. Each chip 900 mainly has a memory area 1000 including memory cells and a logic circuit area 2000 including peripheral circuits of memories. The memory area 1000 is arranged on a central portion of the chip 900, whereas the logic circuit area 2000 is arranged on a peripheral portion of the chip 900 to surround the memory area 1000.

Figure 2:
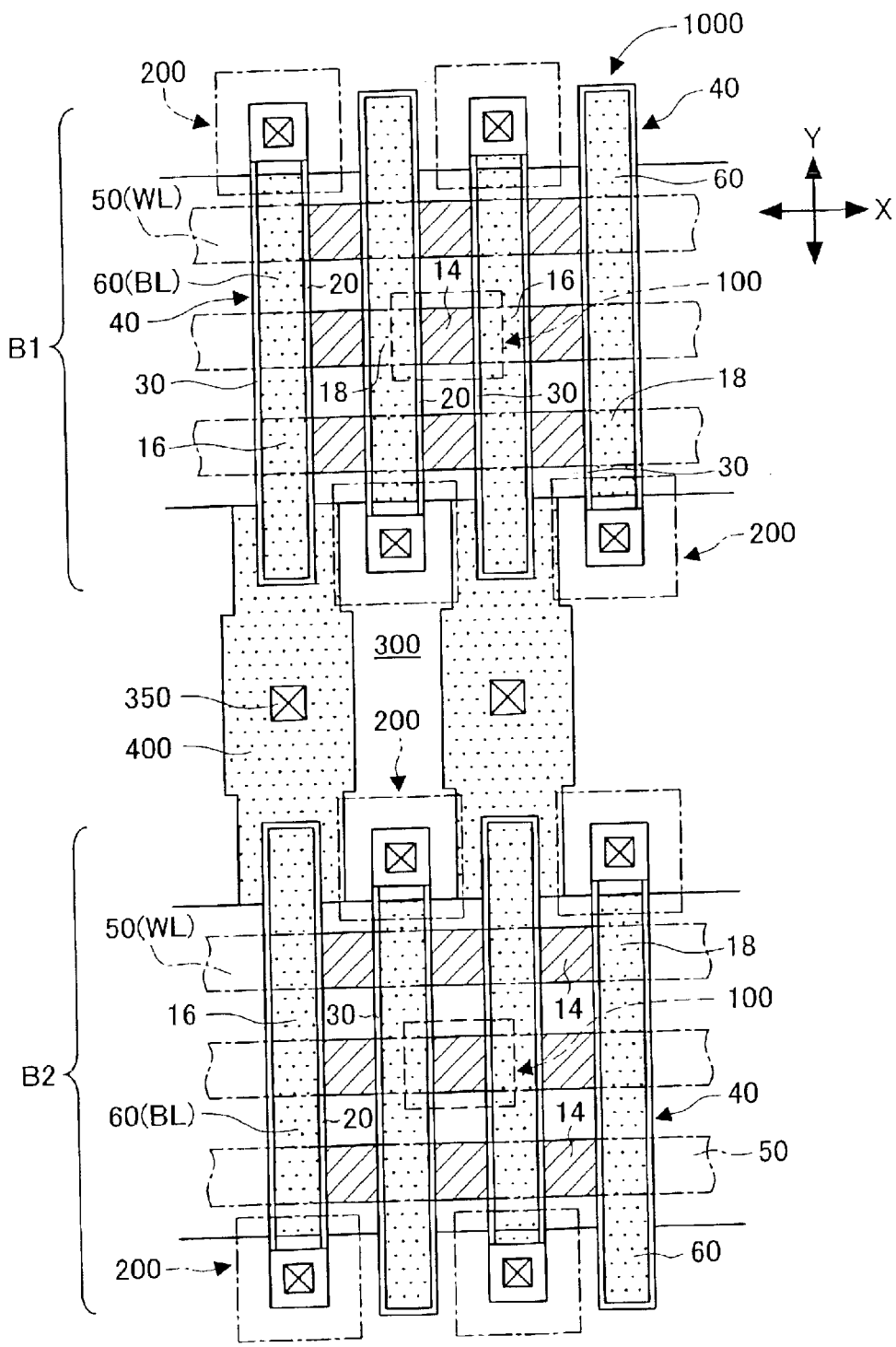
FIG. 2 is a plan view schematically illustrating the layout of a memory area in a semiconductor device.
Figure 3:
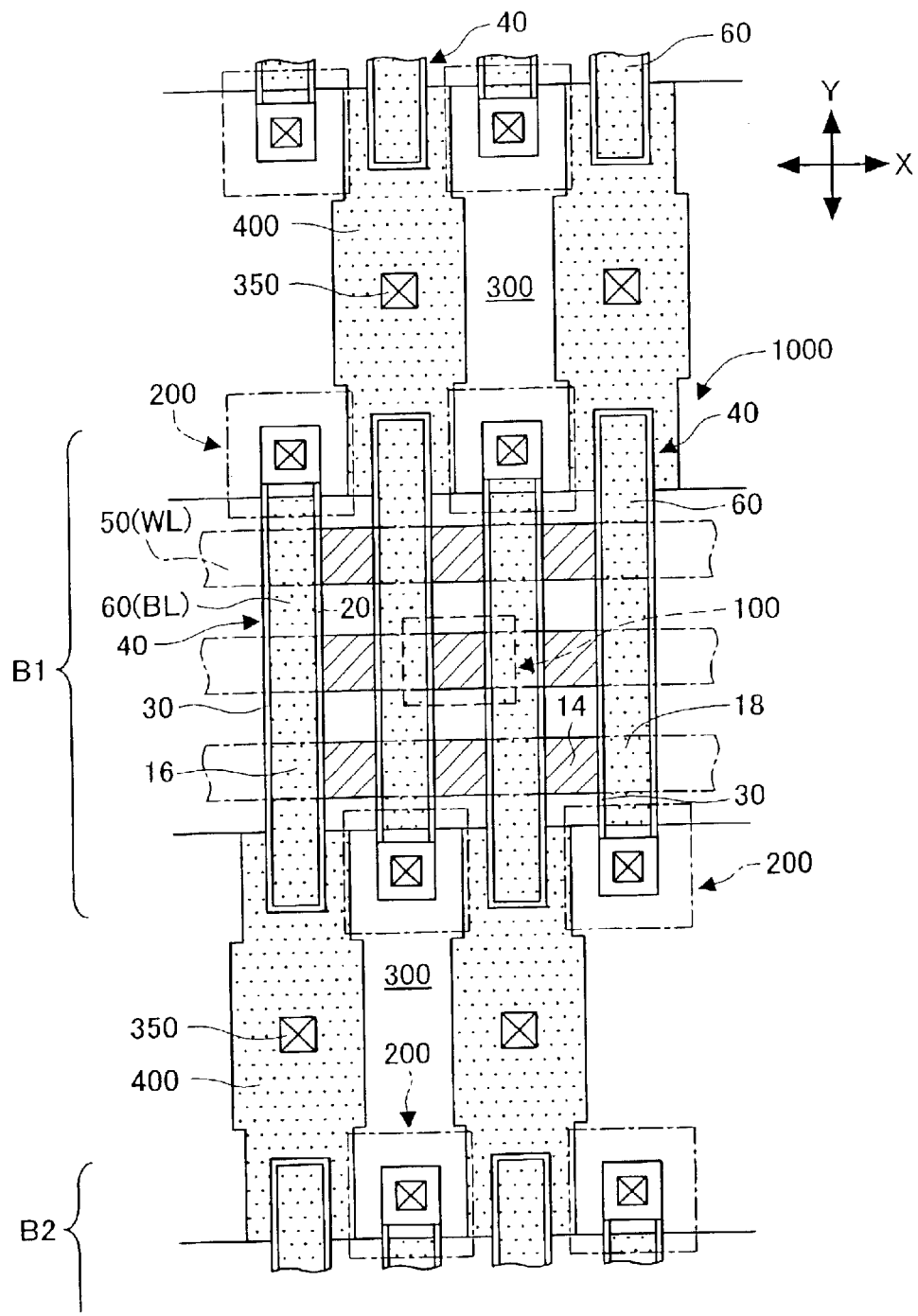
FIG. 3 is another plan view schematically illustrating the layout of the memory area in the semiconductor device.
Figure 4:
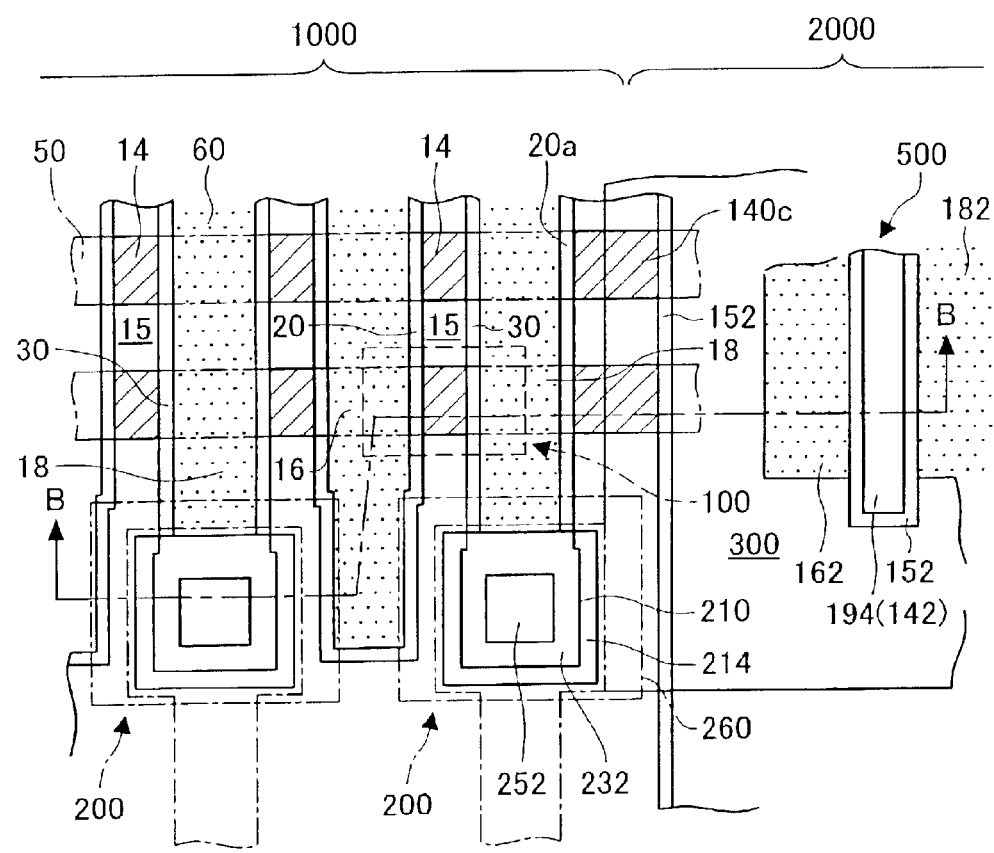
FIG. 4 is a plan view schematically illustrating a main part of the semiconductor memory device.
Figure 5:
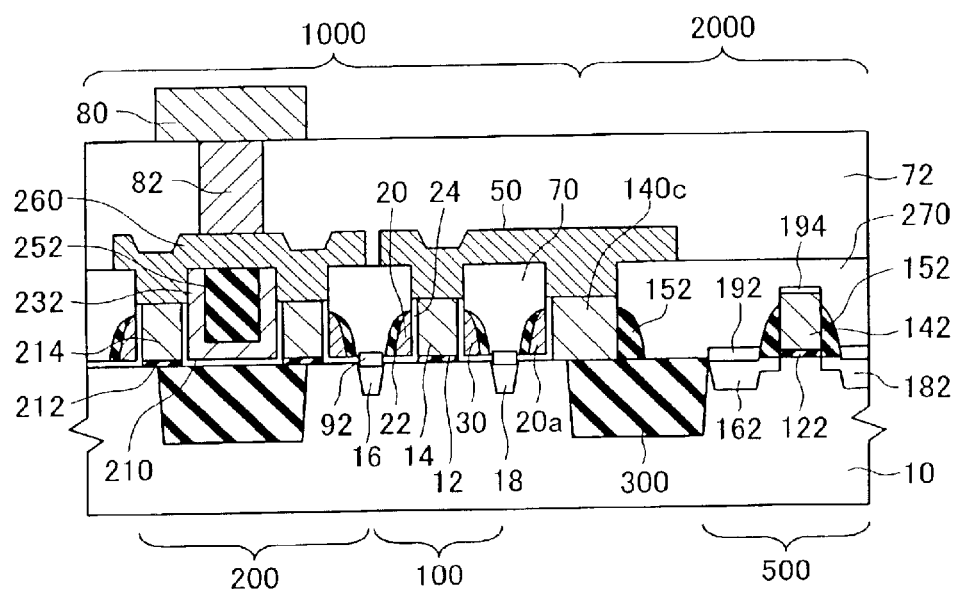
FIG. 5 is a sectional view taken on the line B—B in FIG. 4.

FIGS. 2 and 3 are plan views illustrating the layout of the memory area in the semiconductor device manufactured by the manufacturing method of the embodiment. FIG. 4 is a plan view illustrating part of the semiconductor device manufactured by the manufacturing method of the embodiment. FIG. 5 is a sectional view taken on the line B—B in FIG. 4.

The semiconductor device shown in FIGS. 2 through 5 has the memory area 1000 and the logic circuit area 2000 including peripheral circuits of memories. The memory area 1000 has a memory cell array, in which MONOS non-volatile memory devices (hereafter referred to as 'memory cells') 100 are arranged in a grid of multiple rows and multiple columns.

A. Structure of Device

The layout of the memory area 1000 is discussed first with reference to FIGS. 2 and 3.

FIG. 2 shows a first block B1 and a second block B2 adjoining to the first block B1 as part of the memory area 1000. FIG. 3 shows the contact structure of the first block B1 with the second block B2.

An element separating region 300 is formed in a partial area between the first block B1 and the second block B2. Multiple word lines 50 (WL) extending in a direction X (in a row direction) and multiple bit lines 60 (BL) extending in a direction Y (in a column direction) are arrayed in each block B1 or B2. Each of the word lines 50 is connected to multiple word gates 14 arranged in the direction X. The bit lines 60 are composed of impurity layers 16 and 18.

Conductive layers 40 are formed to surround the respective impurity layers 16 and 18 and constitute first and second control gates 20 and 30. The first and the second control gates 20 and 30 respectively extend in the direction Y. The respective one ends of each pair of the first and the second control gates 20 and 30 are connected with each other via the conductive layer 40 extending in the direction X. The respective other ends of each pair of the first and the second control gates 20 and 30 are linked with one common contact element 200. The first and the second control gates 20 and 30 accordingly have general functions as the control gate of the memory cell and wiring functions of connecting the paired control gates arranged in the direction Y.

Each memory cell 100 has one word gate 14, the first and the second control gates 20 and 30 arranged on both sides of the word gate 14, and the impurity layers 16 and 18 that are formed in the semiconductor substrate and located outside these control gates 20 and 30. The impurity layers 16 and 18 are shared by the adjoining memory cells 100.

The two impurity layers 16 adjoining to each other in the direction Y, that is, the impurity layer 16 formed in the block B1 and the impurity layer 16 formed in the adjoining block B2, are electrically connected with each other via a contact impurity layer 400 formed in the semiconductor substrate. The contact impurity layer 400 is located opposite to the common contact element 200 of the control gates across the impurity layer 16.

A contact 350 is formed on each contact impurity layer 400. The bit lines 60 of the impurity layers 16 are electrically linked with an upper wiring layer via the contacts 350.

Similarly, the two impurity layers 18 adjoining to each other in the direction Y are electrically connected with each other via the contact impurity layer 400 on the side without the common contact element 200 (see FIG. 3).

As shown in FIG. 2, the planar layout of the multiple common contact elements 200 in each block has a zigzag pattern, where the common contact elements 200 are arranged alternately on different sides of the impurity layers 16 and 18. Similarly, as shown in FIG. 3, the planar layout of the multiple contact impurity layers 400 in each block has a zigzag pattern, where the contact impurity layers 400 are arranged alternately on different sides of the impurity layers 16 and 18.

The planar structure and the sectional structure of the semiconductor device are discussed with reference to FIGS. 4 and 5. The logic circuit area 2000 including peripheral circuits of memories is formed adjacent to the memory area 1000. The memory area 1000 is electrically separated from the logic circuit area 2000 by means of the element separating region 300. The memory area 1000 includes at least the multiple memory cells 100. The logic circuit area 2000 includes at least insulated gate field effect transistors (hereafter referred to as 'MOS transistors') 500 constructing logic circuits.

The description first regards the memory area 1000.

As shown in FIG. 5, each memory cell 100 includes the word gate 14 that is formed on a semiconductor substrate 10 via a first gate insulating layer 12, the impurity layers 16 and 18 that are formed in the semiconductor substrate 10 to constitute either a source area or a drain area, and the first and the second control gates 20 and 30 that are formed as side walls along both sides of the word gate 14. Silicide layers 92 are arranged on the top of the impurity layers 16 and 18.

The first control gate 20 is arranged on the semiconductor substrate 10 via a second gate insulating layer 22 and on one side face of the word gate 14 via a side insulating layer 24. Similarly the second control gate 30 is arranged on the semiconductor substrate 10 via the second gate insulating layer 22 and on the other side face of the word gate 14 via the side insulating layer 24.

The second gate insulating layer 22 and the side insulating layer 24 are ONO membranes. More specifically, the second gate insulating layer 22 and the side insulating layer 24 are multi-layered membranes including a silicon oxide bottom layer (first silicon oxide layer (O)), a silicon nitride layer (N), and a silicon oxide top layer (second silicon oxide layer (O)).

The first silicon oxide layer of the second gate insulating layer 22 makes a potential barrier between a channel area and a charge accumulation region.

The silicon nitride layer of the second gate insulating layer 22 functions as a charge accumulation region for trapping carriers (for example, electrons).

The second silicon oxide layer of the second gate insulating layer 22 makes a potential barrier between the control gate and the charge accumulation region.

The side insulating layer 24 electrically separates the word gate 14 from the control gates 20 and 30. In order to prevent a short circuit between the word gate 14 and the first and the second control gates 20 and 30, the upper end of the side insulating layer 24 is located above the upper ends of the control gates 20 and 30 relative to the semiconductor substrate 10.

The side insulating layer 24 and the second gate insulating layer 22 are produced by the same film forming process and have the identical layer structure.

An embedded insulating layer 70 is disposed between the first control gate 20 and the second control gate 30 of the adjoining memory cells 100. The embedded insulating layer 70 covers over at least the control gates 20 and 30 to prevent exposure thereof. In the concrete structure, the upper face of the embedded insulating layer 70 is located above the upper end of the side insulating layer 24 relative to the semiconductor substrate 10. Such arrangement of the embedded insulating layer 70 ensures the electrical separation of the first and the second control gates 20 and 30 from the word gates 14 and the word lines 50.

A conductive layer is formed on the common contact element 200 to apply a predetermined potential to the control gates 20 and 30. The common contact element 200 includes a first contact insulating layer 212, a second contact insulating layer 210, a first contact conductive layer 214, a second contact conductive layer 232, a third contact insulating layer 252, and a third contact conductive layer 260.

The first contact insulating layer 212 is produced by the same manufacturing process as that of the first gate insulating layer 12.

The second contact insulating layer 212 is produced by the same manufacturing process as that of the second gate insulating layer 22 and the side insulating layer 24. The second contact insulating layer 210 is a multi-layered ONO membrane including a first silicon oxide layer, a silicon nitride layer, and a second silicon oxide layer.

The first contact conductive layer 214 is produced by the same manufacturing process as that of the word gate 14. The first contact conductive layer 214 is formed outside the second contact insulating layer 210.

The second contact conductive layer 232 is formed inside the second contact insulating layer 210. The second contact conductive layer 232 is produced by the same manufacturing process as that of the first and the second control gates 20 and 30 to be integrated with these control gates 20 and 30. Namely the second contact conductive layer 232 and the control gates 20 and 30 are made of an identical material.

The third contact insulating layer 252 is formed inside the second contact conductive layer 232. The third contact insulating layer 252 is produced by the same manufacturing process as that of side wall insulating layers 152.

The third contact conductive layer 260 is produced by the same manufacturing process as that of the word line 50 and is linked with the first contact conductive layer 214 and the second contact conductive layer 232.

The MOS transistors 500 are created in the logic circuit area 2000. Each MOS transistor 500 includes a gate electrode 142 that is created on the semiconductor substrate 10 via a third gate insulating film 122, impurity layers 162 and 182 that are formed in the semiconductor substrate 10 to constitute either a source area or a drain area, and side wall insulating layers 152 that are formed along both sides of the gate electrode 142. Silicide layers 192 are arranged on the top of the impurity layers 162 and 182, and a silicide layer 194 is arranged on the top of the gate electrode 142.

In the logic circuit area 2000, the MOS transistors 500 are covered with an insulating layer 270. This insulating layer 270 is produced by the same manufacturing process as that of the embedded insulating layer 70.

As shown in FIGS. 4 and 5, a boundary element 140c, which is composed of the same material as that of the word gate 14 and the gate electrode 142, is arranged in a boundary region between the memory area 1000 and the logic circuit area 2000. The boundary element 140c is produced by the same film forming process as that of the word gate 14 and the gate electrode 142. At least part of the boundary element 140c is formed above the element separating region 300.

A side wall conductive layer 20a, which is composed of the same material as that of the control gates 20 and 30, is arranged on one side face of the boundary element 140c (on the side of the memory area 1000). The side wall conductive layer 20a extends in the direction Y and is electrically connected with the adjoining control gate 30 via the common contact element 200. The side wall conductive layer 20a is not used as the control gate of the memory cell. The electrical connection of the side wall conductive layer 20a with the adjoining control gate 30 causes the electric properties of the control gate 30 adjacent to the side wall conductive layer 20a to be substantially equal to the electric properties of the other control gates.

A side wall insulating layer 152, which is produced by the same manufacturing process as that of the side wall insulating layers 152 of the MOS transistor 500, is arranged on the other side face of the boundary element 140c (on the side of the logic circuit area 2000).

An inter-layer insulating layer 72 is formed on the semiconductor substrate 10 with the memory cells 100 and the MOS transistors 500. The inter-layer insulating layer 72 has contact holes, which run to, for example, the third contact conductive layer 260 of the common contact element 200. Each contact hole is filled with a conductive layer 82 of, for example, a tungsten plug or a copper plug, which is connected to a wiring layer 80 located above the inter-layer insulating layer 72.

B. Basic Manufacturing Method of Semiconductor Device

Prior to description of a manufacturing method of a semiconductor device in one embodiment of the present invention, a basic manufacturing method is discussed with reference to FIGS. 6 through 17. The respective sectional views of FIGS. 6 through 17 correspond to the part taken on the line B—B in FIG. 4. In the drawings of FIGS. 6 through 17, like elements to those shown in FIGS. 2 through 5 are expressed by like numerals and are not specifically described here.

Figure 6:
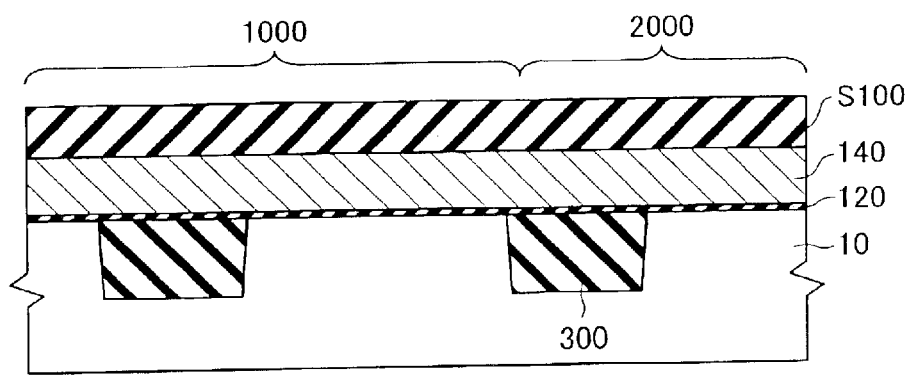
FIG. 6 is a sectional view illustrating one process in a manufacturing method of the semiconductor device shown in FIGS. 2 through 5.

(1) Referring to FIG. 6, the method first forms the element separating regions 300 on the surface of the semiconductor substrate 10 by the technique of trench isolation. The method then forms the contact impurity layers 400 (see FIG. 2) in the semiconductor substrate 10 by the technique of ion implantation.

The method subsequently forms an insulating layer 120, which constructs the gate insulating layers, on the surface of the semiconductor substrate 10, and makes a gate layer 140, which constructs the word gates 14 and the gate electrodes 142, deposit on the insulating layer 120. The gate layer 140 is made of doped polysilicon. A stopper layer S100, which works as an indication of the end of polishing in a later CMP (Chemical Mechanical Polishing) process is further formed on the gate layer 140. The stopper layer S100 is composed of the silicon nitride layer.

The insulating layer 120, the gate layer 140, and the stopper layer S100 respectively correspond to the first insulating layer, the first conductive layer, and the stopper layer of the present invention.

Figure 7:
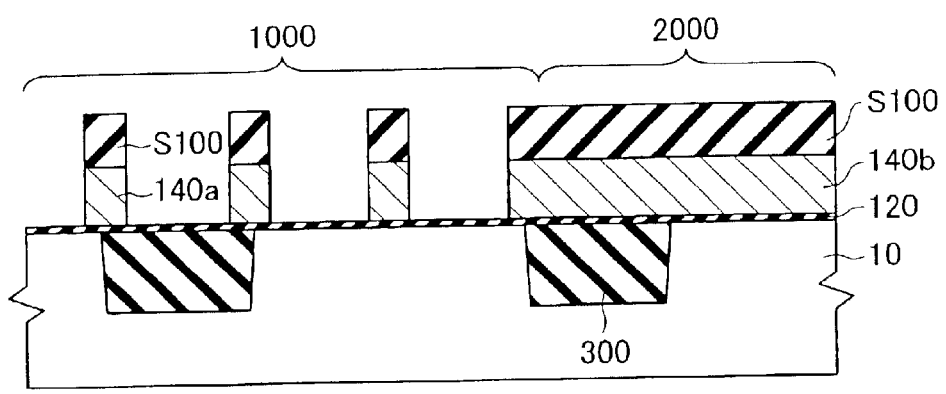
FIG. 7 is a sectional view illustrating one process in the manufacturing method of the semiconductor device shown in FIGS. 2 through 5.

(2) Referring to FIG. 7, a patterned gate layer 140a is formed in the memory area 1000. One concrete procedure for formation of the patterned gate layer 140a forms a resist layer (not shown) on the stopper layer S100 (see FIG. 6) to cover over the whole logic circuit area 2000 and to be extended to part of the memory area 1000. The procedure then patterns the stopper layer S100 with the resist layer as the mask, and etches the gate layer 140 with the patterned stopper layer as the mask. This results in patterning the gate layer 140 to give the patterned gate layer 140a shown in FIG. 7. In this process, the gate layer 140 in the logic circuit area 2000 is not patterned. As a matter of convenience, hereafter the gate layer 140 in the logic circuit area 2000 is called the gate layer 140b.

Figure 8:
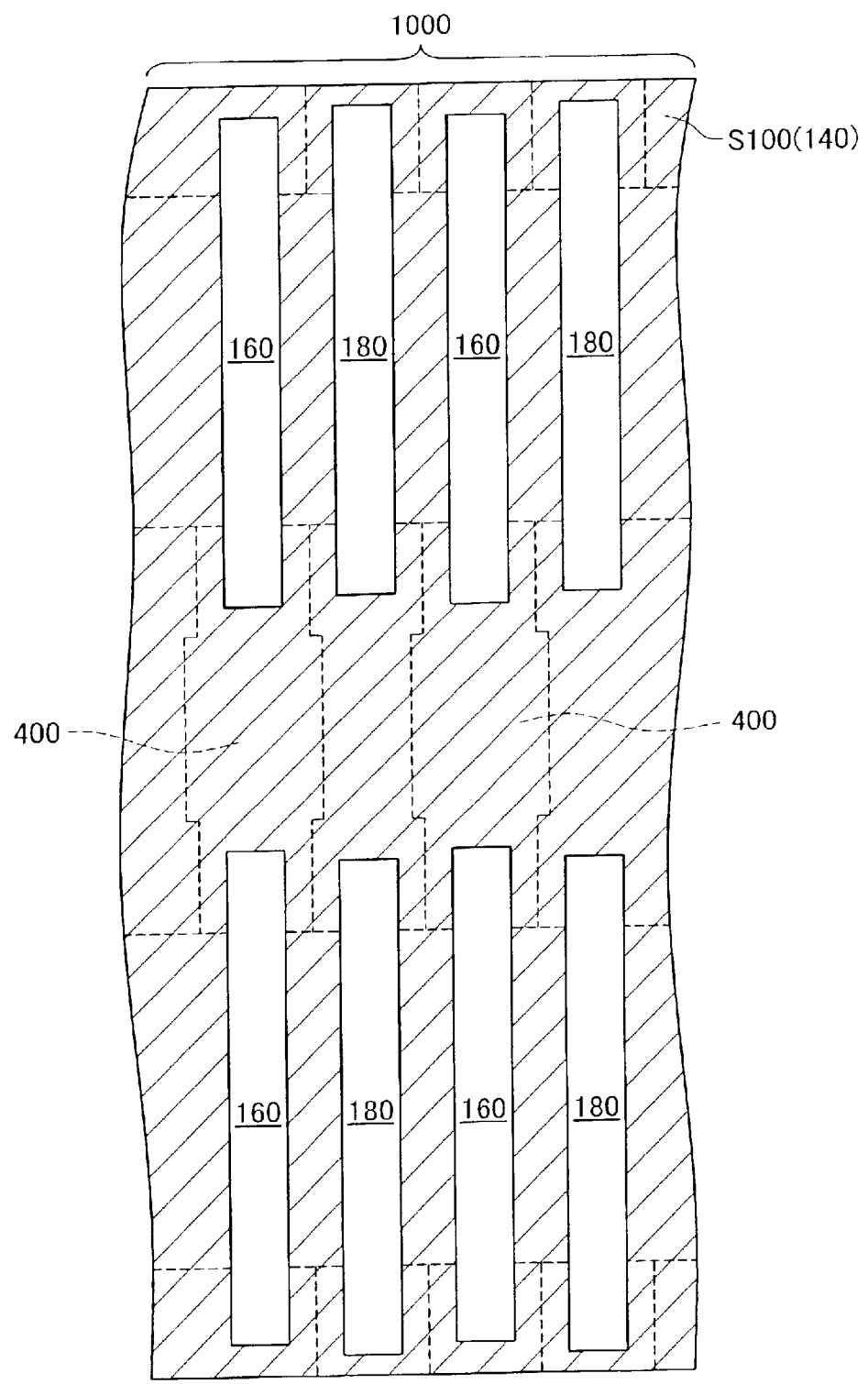
FIG. 8 is a plan view showing one process in the manufacturing method of the semiconductor device shown in FIG. 7.

FIG. 8 is a plan view showing the state of the memory area 1000 after patterning. The patterning makes openings 160 and 180 in the multi-layered body of the gate layer 140 and the stopper layer S100 in the memory area 1000. The openings 160 and 180 substantially correspond to the regions in which the impurity layers 16 and 18 are formed by a later ion implantation process. The side insulating layers and the control gates are formed afterwards along the side faces of the openings 160 and 180.

Figure 9:
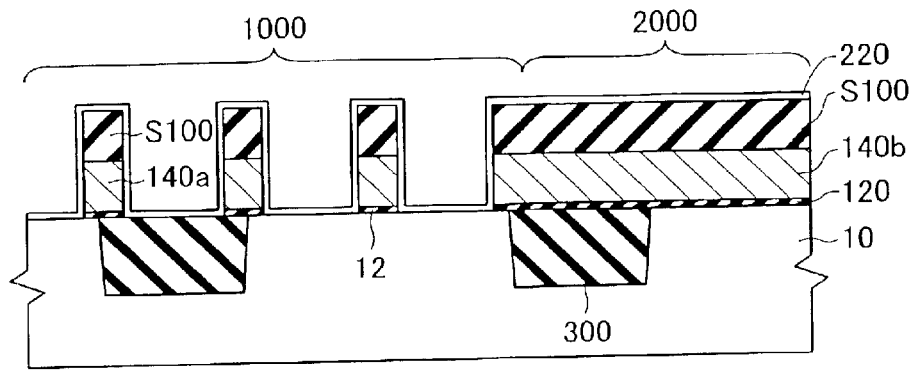
FIG. 9 is a sectional view illustrating one process in the manufacturing method of the semiconductor device shown in FIGS. 2 through 5.

(3) Referring to FIG. 9, an ONO membrane 220 is formed over the whole face of the semiconductor substrate 10. The ONO membrane 220 is obtained by successive deposition of a first silicon oxide layer (O), a silicon nitride layer (N), and a second silicon oxide layer (O). The first silicon oxide layer is formed, for example, by thermal oxidation technique or CVD technique. The silicon nitride layer is formed, for example, by CVD technique. The second silicon oxide layer is formed, for example, by CVD technique or more specifically by high temperature oxidation (HTO) technique. The preferable procedure carries out annealing treatment after formation of these layers to densify the respective layers.

A later patterning process of the ONO membrane 220 makes the second gate insulating layer 22, the side insulating layer 24, and the second contact insulating layer 210 (see FIG. 5).

Figure 10:
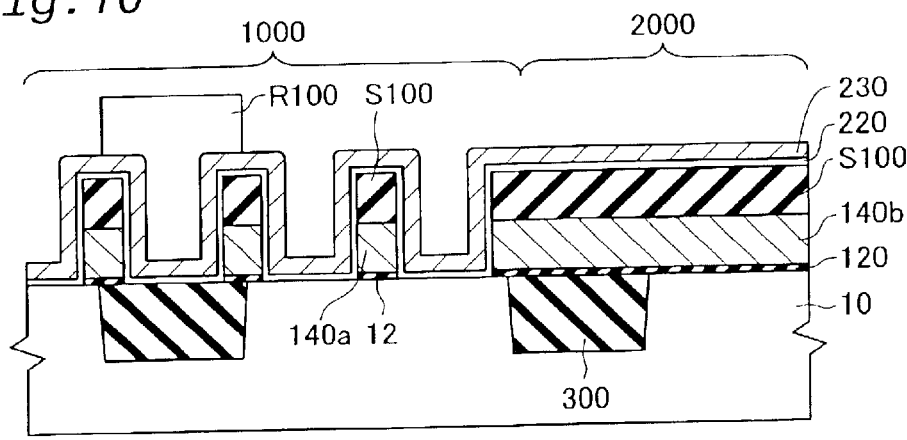
FIG. 10 is a sectional view illustrating one process in the manufacturing method of the semiconductor device shown in FIGS. 2 through 5.

(4) Referring to FIG. 10, a doped polysilicon layer 230 is made to deposit over the whole surface of the ONO membrane 220. A later etching process of the doped polysilicon layer 230 gives the conductive layer 40 (see FIG. 2) of the control gates 20 and 30 and the second conductive layer 232 (see FIG. 4) of the common contact element 200.

A resist layer R100 is then formed in the region for the common contact element 200.

Figure 11:
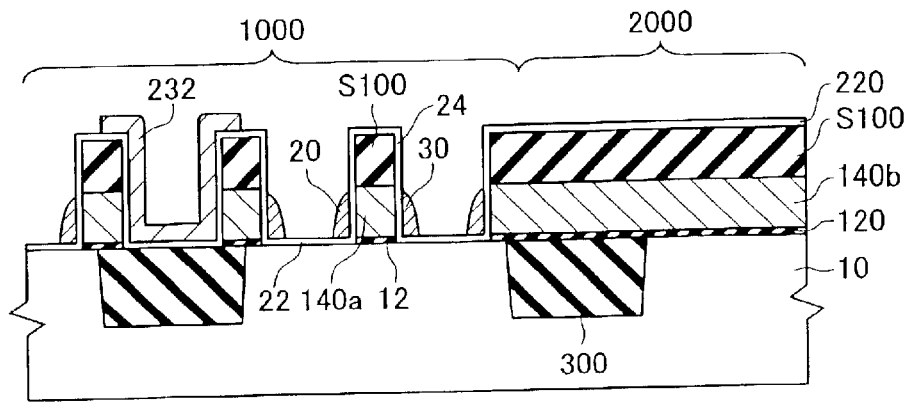
FIG. 11 is a sectional view illustrating one process in the manufacturing method of the semiconductor device shown in FIGS. 2 through 5.

(5) Referring to FIG. 11, anisotropic etching of the whole doped polysilicon layer 230 (see FIG. 10) with the resist layer R100 as the mask gives the first and the second control gates 20 and 30 and the second contact conductive layer 232. This etching process makes the control gates 20 and 30 as the side walls along the side faces of the openings 160 and 180 (see FIG. 8) in the memory area 1000. Simultaneously, the second contact conductive layers 232 are formed in the masked parts with the resist layer R100 (see FIG. 10). The doped polysilicon layer 230 depositing in the logic circuit area 2000 is completely removed. In the boundary region, however, the doped polysilicon layer 230 remains as a side wall on the side face of one end of the gate layer 140b (on the side of the memory area 1000). The resist layer R100 is then removed.

The ONO membrane 220, the control gates 20 and 30, and the doped polysilicon layer 230 respectively correspond to the ONO membrane, the control gate, and the second conductive layer of the present invention.

Figure 12:
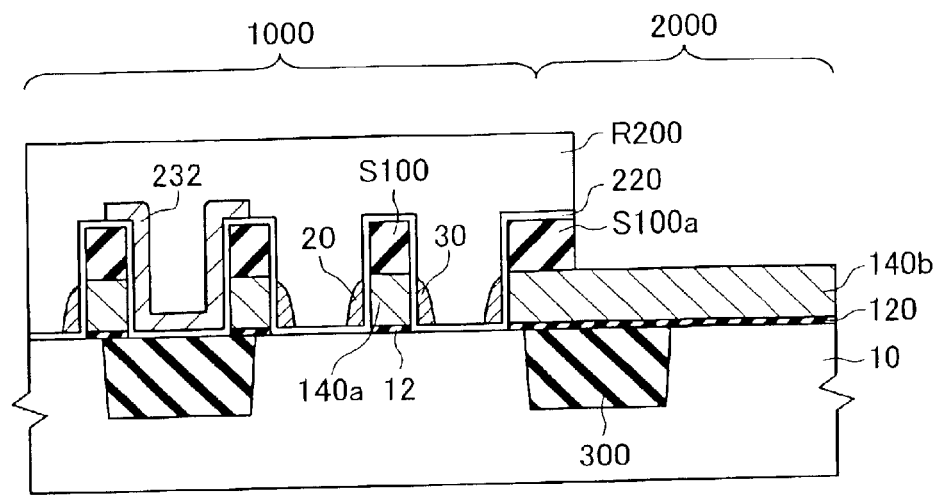
FIG. 12 is a sectional view illustrating one process in the manufacturing method of the semiconductor device shown in FIGS. 2 through 5.

(6) Referring to FIG. 12, a resist layer R200 is then formed to cover over the whole memory area 1000 and to be extended to part of the logic circuit area 2000. The ONO membrane 220 and the stopper layer S100 in the logic circuit area 2000 are removed with the resist layer R200 as the mask. This etching process removes all the stopper layer S100 in the logic circuit area 2000 except the boundary region.

The part of the gate layer 140b located in the boundary region between the memory area 1000 and the logic circuit area 2000 and covered with both the resist layer used in the etching process (2) (see FIG. 7) and the resist layer R200 used in the etching process (6) forms the boundary element 140c (see FIG. 5) in a later process. A stopper layer S100a remaining through this patterning process has a greater width than the width of the remaining stopper layers S100 in the memory area 1000. The resist layer R200 is removed subsequently.

Figure 13:
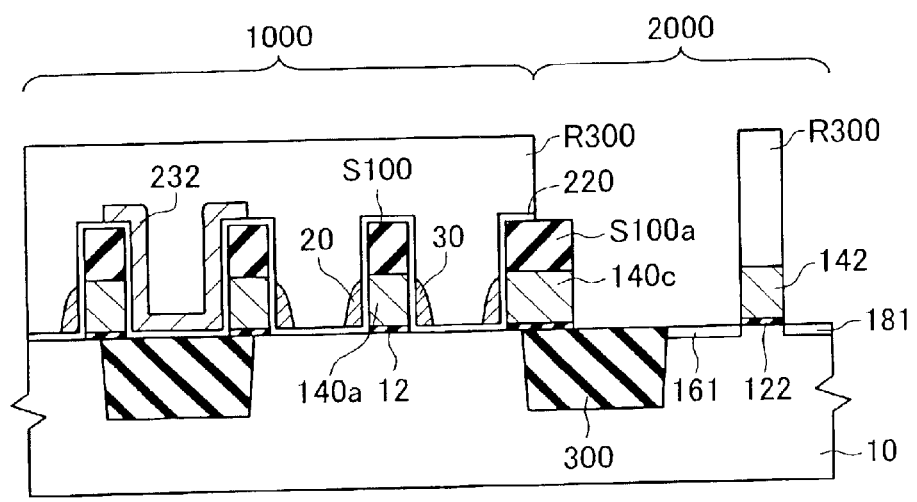
FIG. 13 is a sectional view illustrating one process in the manufacturing method of the semiconductor device shown in FIGS. 2 through 5.

(7) Referring to FIG. 13, a resist layer R300 is formed for creation of the gate electrodes 142. The resist layer R300 is patterned to cover over the whole memory area 1000 and a predetermined part in the logic circuit area 2000. Etching of the gate layer 140b (see FIG. 12) with the resist layer R300 as the mask gives the gate electrodes 142 in the logic circuit area 2000. This etching process also gives the boundary element 140c in the boundary region in a self aligning manner with the resist layer R300 and the stopper layer S100a as the mask.

The resist layer R300 is then removed. Subsequent doping of an N-type impurity creates extension layers 161 and 181 of the source areas and the drain areas in the logic circuit area 2000.

Figure 14:
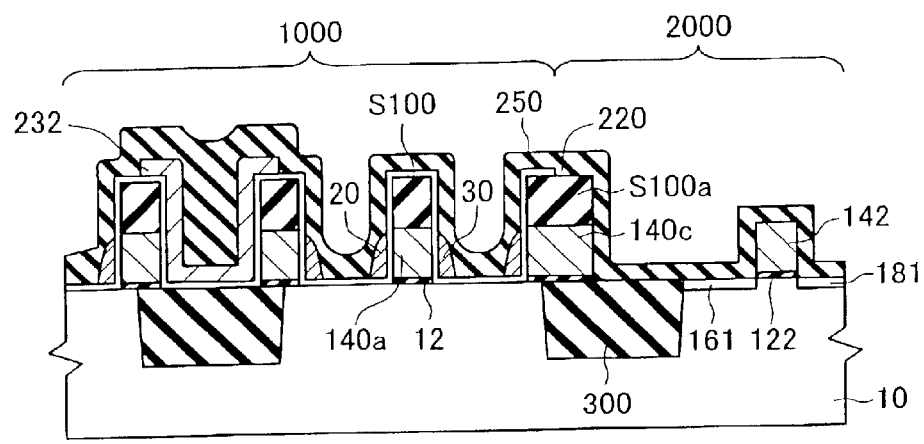
FIG. 14 is a sectional view illustrating one process in the manufacturing method of the semiconductor device shown in FIGS. 2 through 5.

(8) Referring to FIG. 14, an insulating layer 250 of silicon oxide or silicon oxide nitride is formed over the memory area 1000 and the logic circuit area 2000.

Figure 15:
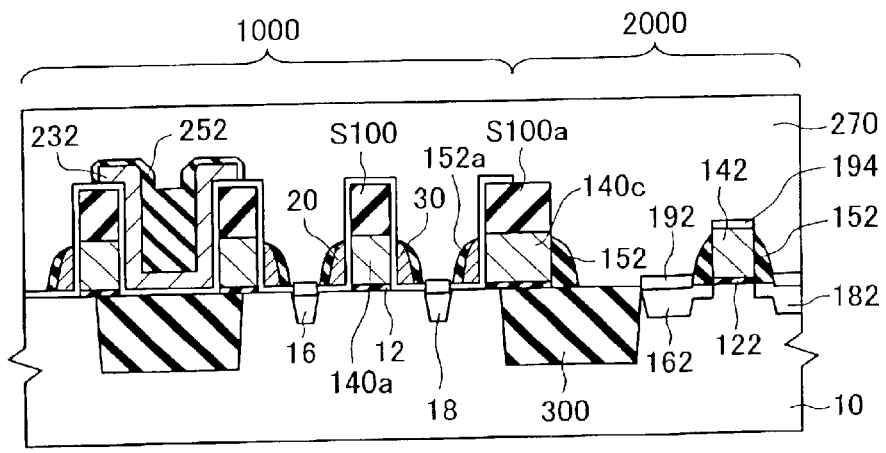
FIG. 15 is a sectional view illustrating one process in the manufacturing method of the semiconductor device shown in FIGS. 2 through 5.

(9) Referring to FIG. 15, anisotropic etching of the whole insulating layer 250 (see FIG. 14) gives the side wall insulating layers 152 on both sides of each gate electrode 142 in the logic circuit area 2000. Simultaneously, the anisotropic etching gives the side wall insulating layer 152 on one side face of the boundary element 140c facing the logic circuit area 2000. This etching process also makes insulating layers 152a remain on the control gates 20 and 30, and forms the third contact insulating layer 252 covering over the second contact conductive layer 232. The etching process removes the insulating layers depositing on specified regions for formation of suicide layers in a later process and on the gate electrodes 142 in the logic circuit area 2000 to expose the semiconductor substrate 10. The specified regions include, for example, regions for formation of the impurity layers 16 and 18 in the memory area 1000 and regions for formation of the impurity layers 162 and 182 in the logic circuit area 2000 in a later ion implantation process.

Subsequent implantation of an N-type impurity ion forms the impurity layers 16 and 18, each of which constitutes either a source area or a drain area in the memory area 1000, and the impurity layers 162 and 182, each of which constitutes either a source area or a drain area in the logic circuit area 2000, in the semiconductor substrate 10.

A subsequent process makes a metal for formation of a suicide deposit on the whole surface. Typical examples of the metal for formation of the silicide are titanium and cobalt. The metal depositing on the impurity layers 16, 18, 162, and 182 and the gate electrodes 142 is subjected to a silicidation reaction. This forms the silicide layers 92 on the top of the impurity layers 16 and 18, the silicide layers 192 on the top of the impurity layers 162 and 182, and the silicide layer 194 on the top of the gate electrodes 142. This silicidation process silicidates the gate electrodes and either the source areas or the drain areas of the MOS transistors 500 (see FIG. 5) in a self aligning manner in the logic circuit area 2000. Simultaneously, the silicidation process silicidates the surface of either the source areas or the drain areas of the memory cells 100 (see FIG. 5) in a self aligning manner in the memory area 1000.

The insulating layer 270 of silicon oxide or silicon oxide nitride is formed over the whole surface of the memory area 1000 and the logic circuit area 2000. The insulating layer 270 is formed to cover over the stopper layers S100 and S100a.

Figure 16:
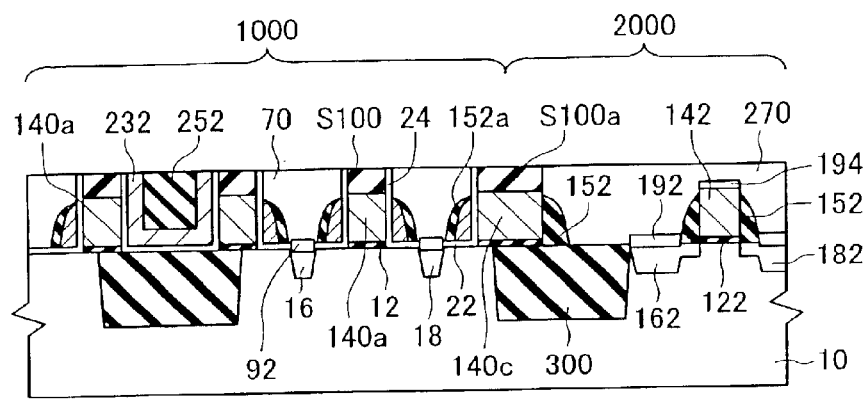
FIG. 16 is a sectional view illustrating one process in the manufacturing method of the semiconductor device shown in FIGS. 2 through 5.

(10) Referring to FIG. 16, the insulating layer 270 is polished by the CMP technique to exposure of the stopper layers S100 and S100a and is leveled off. The polishing makes the insulating layer 270 remain between the two side insulating layers 24 facing each other across the control gates 20 and 30 to define the embedded insulating layer 70.

The upper ends of the side insulating layers 24 formed on the side faces of the gate layer 140a and the stopper layer S100 are located above the upper ends of the first and the second control gates 20 and 30 relative to the semiconductor substrate 10. It is preferable that the MOS transistors 500 are completely covered with the insulating layer 270 in the logic circuit area 2000.

On completion of this polishing process, the stopper layers S100 and S100a are accordingly present on the gate layer 140a, which constructs the word gates 14, and the boundary element 140c, respectively. No stopper layer is present on the gate electrodes 142, but the gate electrodes 142 are covered with the insulating layer 270.

(11) The stopper layers S100 and S100a (see FIG. 16) are removed with hot phosphoric acid. This results in exposure of at least the upper faces of the gate layer 140a and the boundary element 140c. A doped polysilicon layer is then made to deposit on the whole surface.

Figure 17:
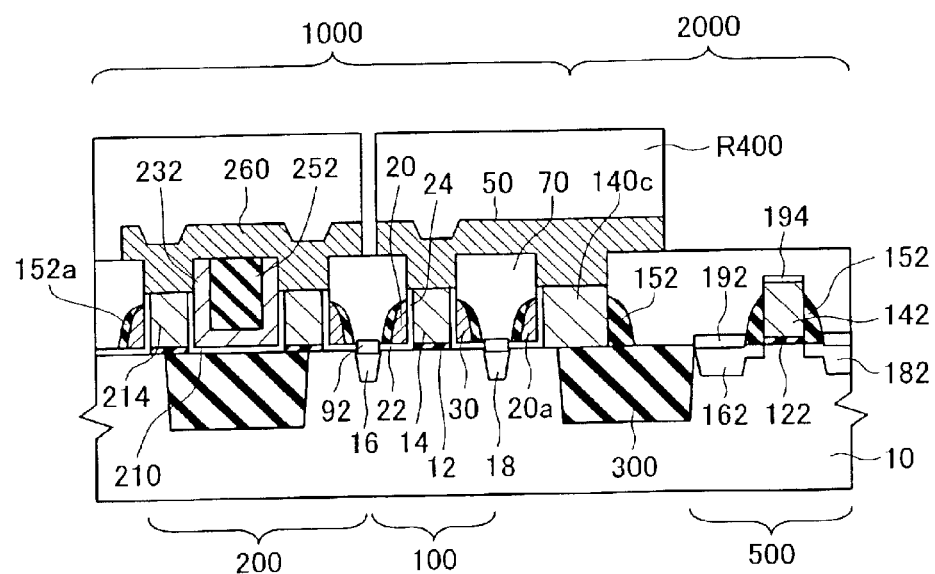
FIG. 17 is a sectional view illustrating one process in the manufacturing method of the semiconductor device shown in FIGS. 2 through 5.

Referring to FIG. 17, a patterned resist layer R400 is subsequently formed on the depositing doped polysilicon layer. Etching and patterning of the doped polysilicon layer with the resist layer R400 as the mask gives the word lines 50 and the third contact conductive layer 260.

The gate layer 140a (see FIG. 16) is etched with the resist layer R400 as the mask. The etching removes part of the gate layer 140a where the word lines 50 are not formed thereon. This gives the word gates 14 arranged in an array. The removed part of the gate layer 140a corresponds to the region of a P-type impurity layer (element separating impurity layer) 15 created in a later process (see FIG. 4).

The conductive layer 40, which constructs the first and the second control gates 20 and 30, is covered with the embedded insulating layer 70 and is thus not etched but remains by this etching process. The MOS transistors 500 in the logic circuit area 2000 are not affected by this etching process, as long as the MOS transistors 500 are completely covered with the insulating layer 270.

The whole semiconductor substrate 10 is then doped with a P-type impurity. The P-type impurity layer (element separating impurity layer) 15 (see FIG. 4) is accordingly formed between each pair of the word gates 14 adjoining to each other in the direction Y. The P-type impurity layer 15 ensures separation between the adjoining memory cells 100.

(12) The process subsequently forms a first inter-layer insulating layer, makes contact holes by any known method, and creates a conductive layer in each contact hole and a first wiring layer. For example, as shown in FIG. 5, the process forms the inter-layer insulating layer 72, makes contact holes in the inter-layer insulating layer 72, and creates the conductive layer 82 and the wiring layer 80 connecting with each contact element 200. This process simultaneously creates contact elements and a wiring layer in the logic circuit area 2000.

The series of processes discussed above manufactures the semiconductor device shown in FIGS. 2 through 5.

C. Details of Polishing Process of Insulating Layer by CMP

Figures 18A, 18B:
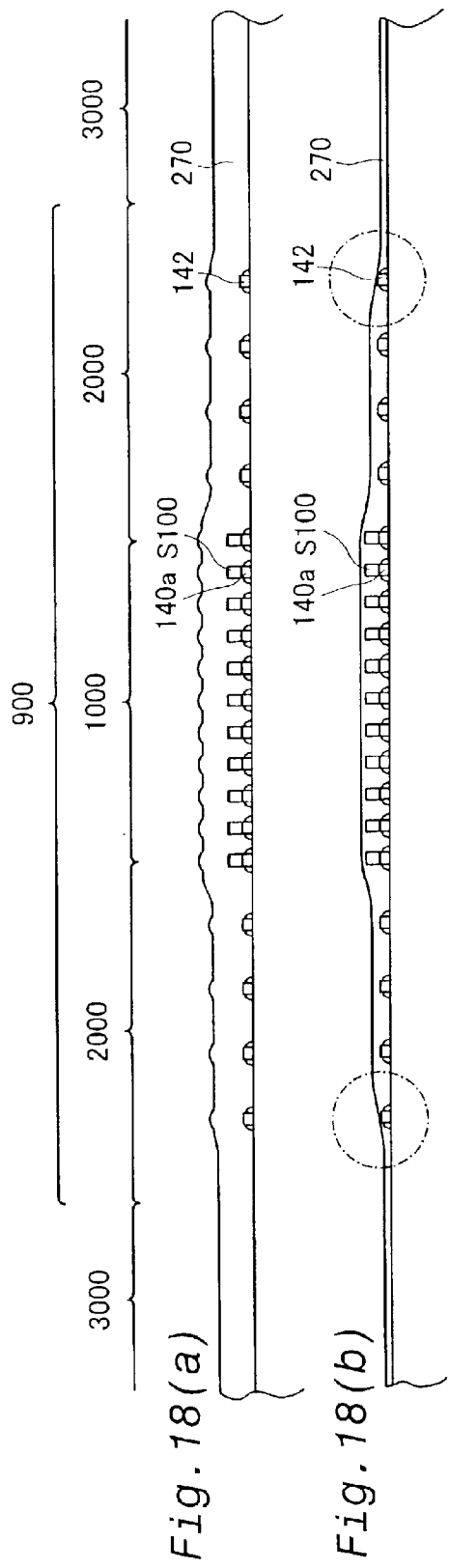
FIGS. 18(a) and 18(b) show the state of a whole chip before and after a prior art polishing process by CMP technique.

FIGS. 18(a) and 18(b) show the state of a whole chip before and after the polishing process (10) by the CMP technique (see FIG. 16) discussed above. FIG. 18 schematically illustrates the cross section of the memory area and the logic circuit area on one chip as well as the scribing area between adjoining chips. This corresponds to the part taken on the line A—A in FIG. 1. For simplicity of explanation, the dimensions and the dimension ratio in FIG. 18 do not represent the actual dimensions and the actual dimension ratio. FIG. 18(a) shows the state before the polishing process, and FIG. 18(b) shows the state after the polishing process.

As discussed above in the process (9), after the silicidation process, the insulating layer 270 is formed over the memory area 1000 and the logic circuit area 2000 (see FIG. 15). The insulating layer 270 actually covers over the whole surface of the semiconductor wafer. The insulating layer 270 is accordingly present not only on the memory area 1000 and the logic circuit area 2000 on each chip 900 but on the scribing area 3000 between the adjoining chips 900. As shown in FIG. 18(a), there are multiple protrusions on the top surface of the insulating layer 270 in the memory area 1000 and the logic circuit area 2000 on the chip 900. These protrusions correspond to the gate layers 140a in the memory area 1000 and the gate electrodes 142 in the logic circuit area 2000 under the insulating layer 270.

On the chip 900, the gate layers 140a are formed at a relatively high density in the memory area 1000, while the gate electrodes 142 are formed at a relatively low density in the logic circuit area 2000. The density of the protrusions on the top surface of the insulating layer 270 is thus relatively high in the memory area 1000 and is relatively low in the logic circuit area 2000. The scribing area 3000 between the adjoining chips 900 has no gate layers nor gate electrodes. There are accordingly no such protrusions on the top surface of the insulating layer 270 in the scribing area 3000.

After formation of the insulating layer 270, the insulating layer 270 is polished by the CMP technique to exposure of the stopper layers S100 and S100a, as discussed above in the process (10). Such polishing is naturally carried out over the whole surface of the semiconductor wafer. Namely the insulating layer 270 is polished not only in the memory area 1000 and the logic circuit area 2000 on the chip 900 but in the scribing area 3000 between the adjoining chips 900.

There may be a variation in polishing rate of the insulating layer 270 among the respective areas, due to the varying density of the multiple protrusions present on the top surface of the insulating layer 270. More specifically, the insulating layer 270 in the logic circuit area 2000 having a relatively low density of the protrusions is polished relatively faster than the insulating layer 270 in the memory area 1000 having a relatively high density of the protrusions. The insulating layer 270 in the scribing area 3000 with no protrusions is polished faster than the insulating layer 270 in the memory area 1000 and in the logic circuit area 2000 with the protrusions.

As shown in FIG. 18(b), the polished depth of the insulating layer 270 in the scribing area 3000 between the adjoining chips 900 is accordingly greater than the polished depths in the memory area 1000 and in the logic circuit area 2000 on the chip 900. The insulating layer 270 on a part of the chip 900 close to the scribing area 3000, that is, on the peripheral portion of the chip 900 (for example, the parts encircled by the one-dot chain line) may thus be polished excessively.

The peripheral portion of the chip 900 is the logic circuit area 2000. The gate electrodes 142 present in the excessively polished portion of the logic circuit area 2000 may be exposed prior to exposure of the stopper layers S100 in the memory area 1000, in the process of polishing the insulating layer 270 as shown in FIG. 18(b).

The silicide layer 194 has been formed on the upper face of the gate electrodes 142 in the precedent process (9) (see FIG. 15). Exposure of the gate electrodes 142 in the logic circuit area 2000 in the process of polishing the insulating layer 270 may cause the silicide layer 194 to be polished and contaminate a CMP apparatus (not shown) used for polishing the insulating layer with metals.

The exposed gate electrodes 142 in the logic circuit area 2000 may be etched out in the subsequent process (11) (see FIG. 17) of etching and patterning the depositing doped polysilicon layer to form the word lines 50.

D. Manufacturing Method of Embodiment

A manufacturing method of a semiconductor device in one embodiment of the present invention forms a patterned gate layer as a dummy circuit in the peripheral portion of the chip 900 simultaneously with formation of the patterned gate layer 140a in the memory area 1000 (see FIG. 7) as discussed previously in the process (2). The manufacturing method then carries out the process (10) of polishing the insulating layer 270 by the CMP technique discussed above.

FIGS. 19 through 28 are sectional views showing the respective steps in the manufacturing method of the semiconductor device in the embodiment of the present invention. The cross section in the vicinity of the peripheral portion of the chip 900 is schematically illustrated in FIGS. 19 through 28.

Figure 19:
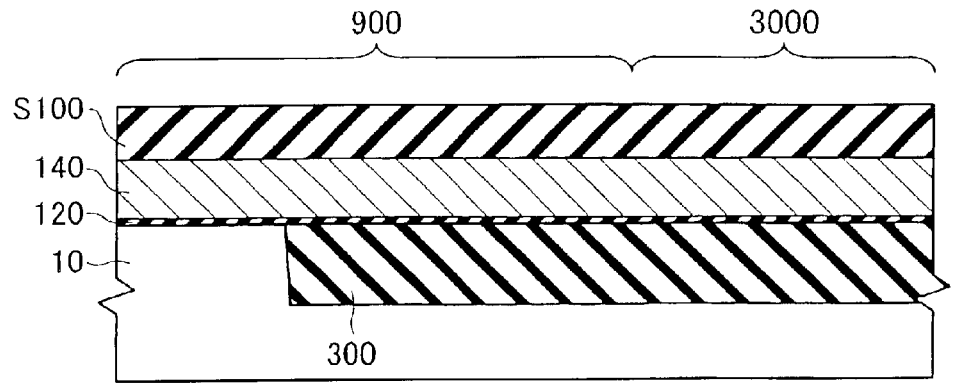
FIG. 19 is a sectional view illustrating one process in the manufacturing method of the semiconductor device in the embodiment of the present invention.

The process (1) forms the element separating regions 300 on the surface of the semiconductor substrate 10 as discussed above. In this process, the element separating region 300 is also formed in the peripheral portion of the chip 900 and in the scribing area 3000 between adjoining chips 900 as shown in FIG. 19.

The method then successively forms the insulating layer 120, the gate layer 140, and the stopper layer S100 on the whole surface of the semiconductor substrate 10 including the peripheral portions of the respective chips 900 and the scribing areas 3000 between adjoining chips 900.

Figure 20:
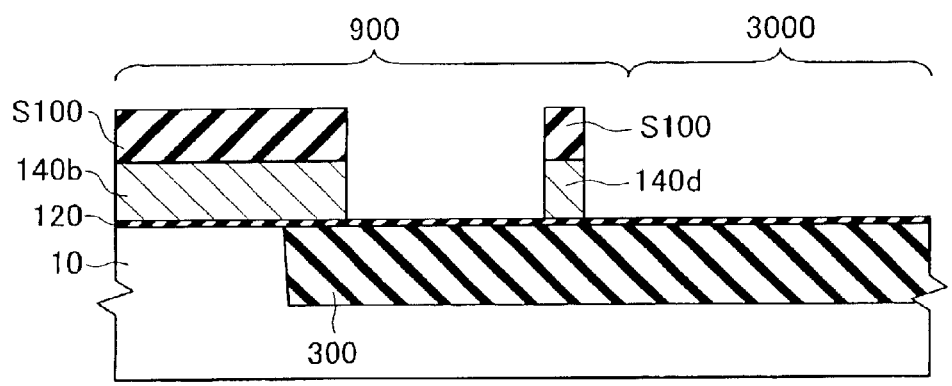
FIG. 20 is a sectional view illustrating one process in the manufacturing method of the semiconductor device in the embodiment of the present invention.

The process (2) forms the patterned gate layer 140a in the memory area 1000 as discussed above. In this process, a patterned gate layer 140d is formed as a dummy circuit in the peripheral portion of each chip 900 as shown in FIG. 20.

Figure 21:
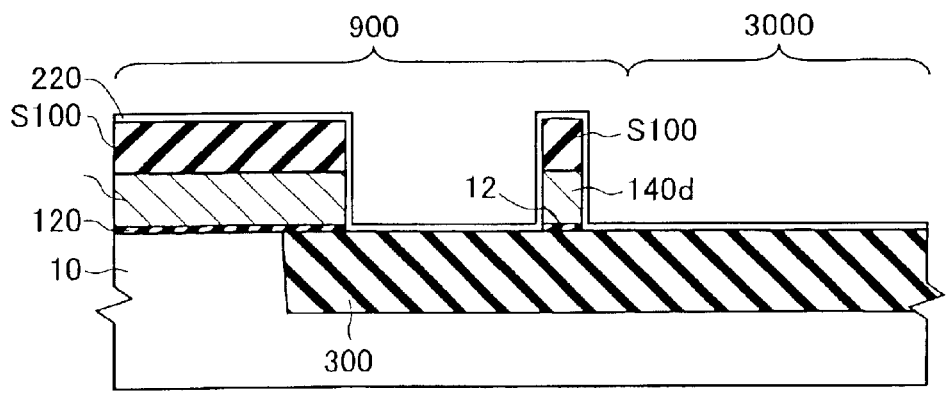
FIG. 21 is a sectional view illustrating one process in the manufacturing method of the semiconductor device in the embodiment of the present invention.

The process (3) forms the ONO membrane 220 on the whole surface of the semiconductor substrate 10 including the peripheral portions of the respective chips 900 and the scribing areas 3000 between adjoining chips 900 as shown in FIG. 21.

Figure 22:
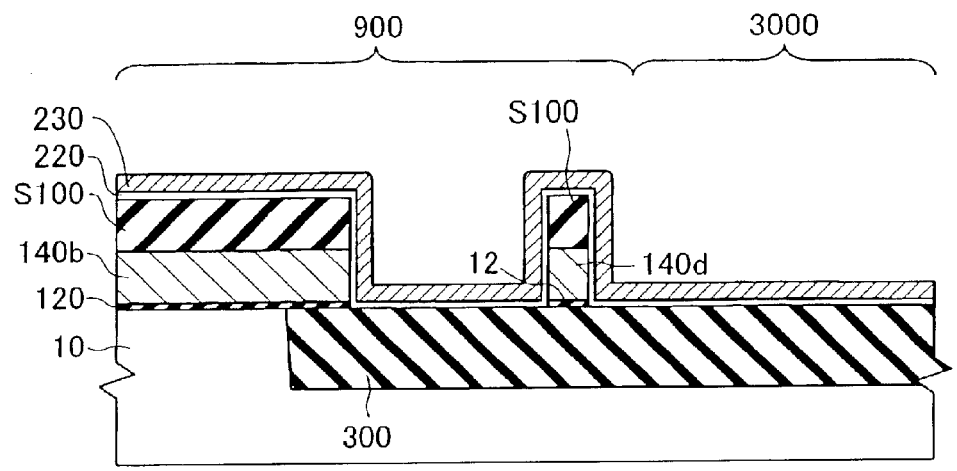
FIG. 22 is a sectional view illustrating one process in the manufacturing method of the semiconductor device in the embodiment of the present invention.

The process (4) forms the doped polysilicon layer 230 on the whole surface of the ONO membrane 220 including the peripheral portions of the respective chips 900 and the scribing areas 3000 between adjoining chips 900 as shown in FIG. 22.

Figure 23:
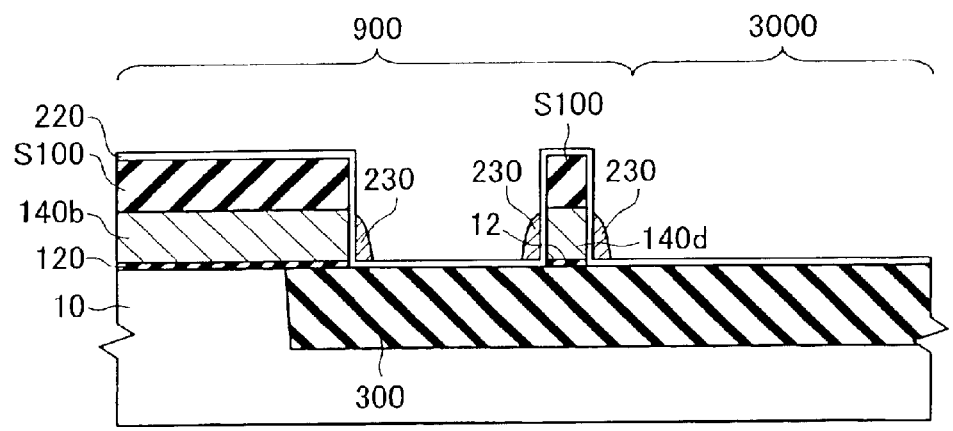
FIG. 23 is a sectional view illustrating one process in the manufacturing method of the semiconductor device in the embodiment of the present invention.

The process (5) carries out anisotropic etching of the whole doped polysilicon layer 230. The doped polysilicon layer 230 accordingly remains as side walls on both side faces of the gate layer 140d and on one side face of the gate layer 140b (on the side of the peripheral portion of the chip 900) as shown in FIG. 23.

Figure 24:
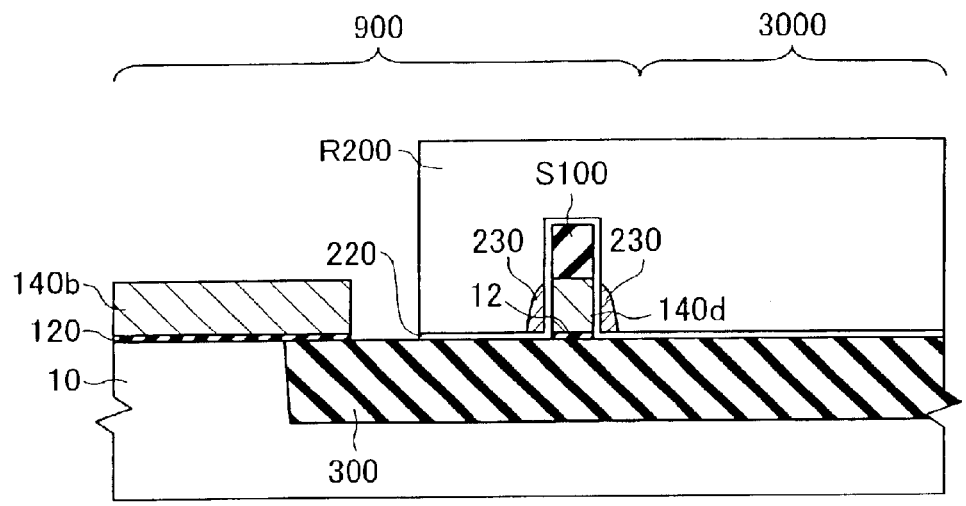
FIG. 24 is a sectional view illustrating one process in the manufacturing method of the semiconductor device in the embodiment of the present invention.

The process (6) forms the resist layer R200 to cover over the peripheral portion of the chip 900 and the scribing area 3000 between adjoining chips 900 as well as the memory area 1000 as shown in FIG. 24. The ONO membrane 220 and the stopper layer S100 in the non-required portions are then removed with the resist layer R200 as the mask. This process also removes the doped polysilicon layer 230 remaining as a side wall on one side face of the gate layer 140b (on the side of the peripheral portion of the chip 900).

Figure 25:
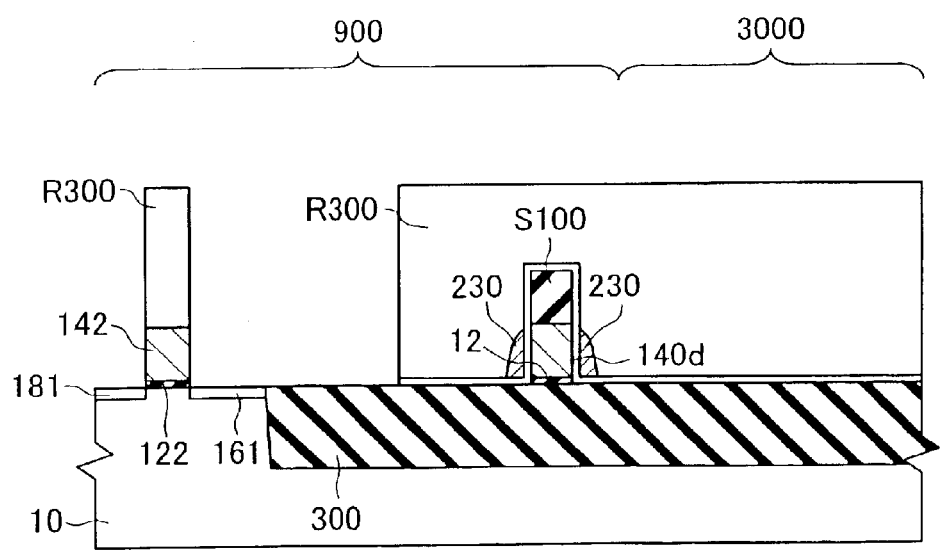
FIG. 25 is a sectional view illustrating one process in the manufacturing method of the semiconductor device in the embodiment of the present invention.

The process (7) forms the resist layer R300 for creation of the gate electrodes 142 to cover over the peripheral portion of the chip 900 and the scribing area 3000 between adjoining chips 900 as well as the memory area 1000 as shown in FIG. 25. Etching the gate layer 140b with the resist layer R300 as the mask gives the gate electrodes 142 in the logic circuit area 2000.

Figure 26:
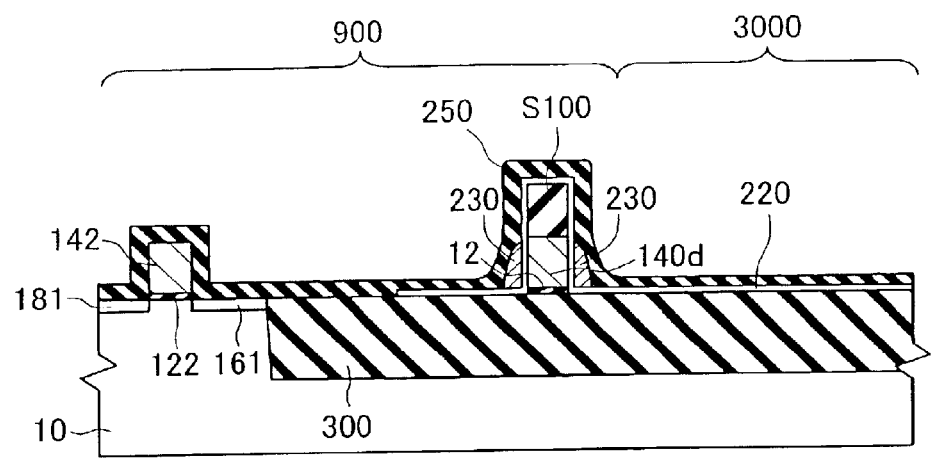
FIG. 26 is a sectional view illustrating one process in the manufacturing method of the semiconductor device in the embodiment of the present invention.

The process (8) forms the insulating layer 250 over the whole surface of the semiconductor substrate 10 including the peripheral portions of the respective chips 900 and the scribing areas 3000 between adjoining chips 900 as shown in FIG. 26.

Figure 27:
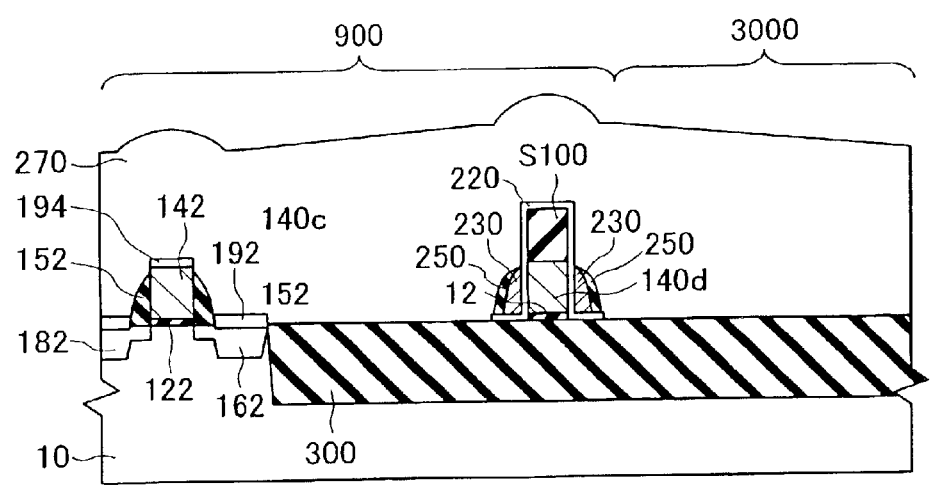
FIG. 27 is a sectional view illustrating one process in the manufacturing method of the semiconductor device in the embodiment of the present invention.

The process (9) carries out anisotropic etching of the whole insulating layer 250 to cover over the peripheral portion of the chip 900 and the scribing area 3000 between adjoining chips 900 as well as the memory area 1000 as shown in FIG. 27. This gives the side wall insulating layers 152 on both side faces of each gate electrode 142 in the logic circuit area 2000. The insulating layer 150 is left on the doped polysilicon layer 230 remaining as side walls on both side faces of the gate layer 140d.

The method subsequently implants an N-type impurity ion into the semiconductor substrate 10 to make the impurity layers 16, 18, 162, and 182. Because of the presence of the element separating region 300, no impurity layer is formed in the peripheral portion of each chip 900 and the scribing area 3000 between adjoining chips 900. The depositing metal is subjected to the silicidation reaction for formation of the silicide layers 92 and 192. Because of the presence of the element separating region 300, no silicide layer is formed in the peripheral portion of each chip 900 and the scribing area 3000 between adjoining chips 900.

The method then forms the insulating layer 270 of silicon oxide or silicon oxide nitride over the whole surface of the semiconductor substrate 10 including the peripheral portions of the respective chips 900 and the scribing areas 3000 between adjoining chips 900.

Figure 28:
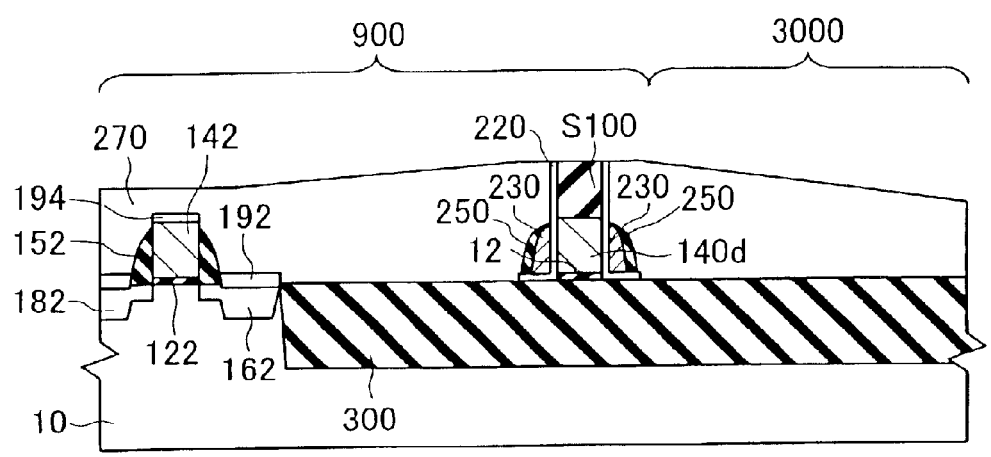
FIG. 28 is a sectional view illustrating one process in the manufacturing method of the semiconductor device in the embodiment of the present invention.

The process (10) polishes the insulating layer 270 by the CMP technique to exposure of the stopper layers S100 as shown in FIG. 28.

Figure 29:
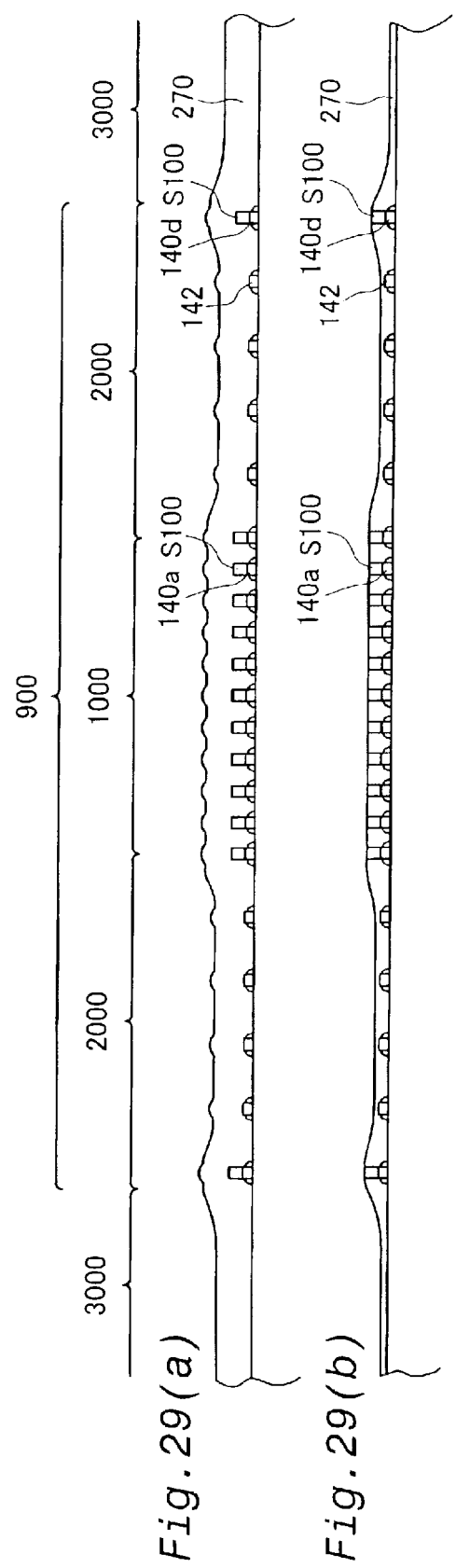
FIGS. 29(a) and 29(b) show the state of the whole chip before and after a polishing process by CMP technique in the manufacturing method of the semiconductor device in the embodiment of the present invention.

FIGS. 29(a) and 29(b) show the state of the whole chip before and after the polishing process by the CMP technique in the manufacturing method of the semiconductor device in the embodiment of the present invention. FIG. 29 schematically illustrates the cross section of the memory area and the logic circuit area on one chip as well as the scribing area between adjoining chips. This corresponds to the part taken on the line A—A in FIG. 1. FIG. 29(a) shows the state before the polishing process, and FIG. 29(b) shows the state after the polishing process.

As shown in FIGS. 27 and 29(a); in the process of forming the insulating layer 270 over the whole surface of the semiconductor substrate 10, formation of the gate layer 140d as the dummy circuit on the peripheral portion of the chip 900 newly causes a protrusion on the top surface of the insulating layer 270 above the gate layer 140d.

Subsequent polishing of the insulating layer 270 by the CMP technique results in the state shown in FIGS. 28 and 29(b). Even if the insulating layer 270 in the scribing area 3000 between adjoining chips 900 is polished faster and thereby to a greater degree than the insulating layer 270 in the memory area 1000 and the logic circuit area 2000 on the chip 900, the presence of the new protrusion on the top surface of the insulating layer 270 effectively reduces the polishing rate of the insulating layer 270 on the peripheral portion of the chip 900. The reduced polishing rate decreases the polishing degree and thus prevents the peripheral portion of the chip 900 from being polished excessively.

This arrangement effectively prevents the gate electrodes 142 in the logic circuit area 2000 on the peripheral portion of the chip 900 from being exposed by polishing the insulating layer 270, prior to exposure of the stopper layers S100 in the memory area 1000.

The gate layer 140d formed as the dummy circuit on the peripheral portion of the chip 900 is etched out in the process (11) of forming the word lines 50 after the polishing process.

The above embodiment and its application are to be considered in all aspects as illustrative and not restrictive. There may be many modifications, changes, and alterations without departing from the scope or spirit of the main characteristics of the present invention.

The method of the embodiment forms the patterned gate layer as the dummy circuit on the peripheral portion of each chip 900. The technique of the present invention is, however, not restricted to this arrangement. A patterned gate layer may be formed as a dummy circuit in the scribing area 3000 between adjoining chips 900.

Figure 30:
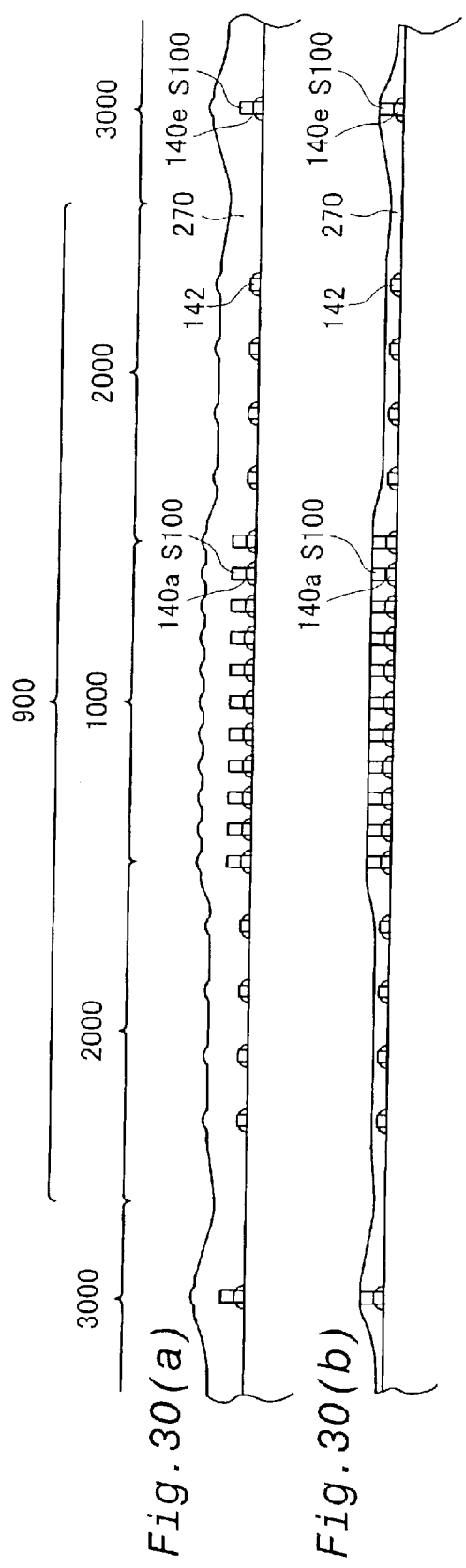
FIGS. 30(a) and 30(b) show the state of the whole chip before and after a polishing process by CMP technique in another manufacturing method of the semiconductor device in one modified example of the present invention.
Figure 31:
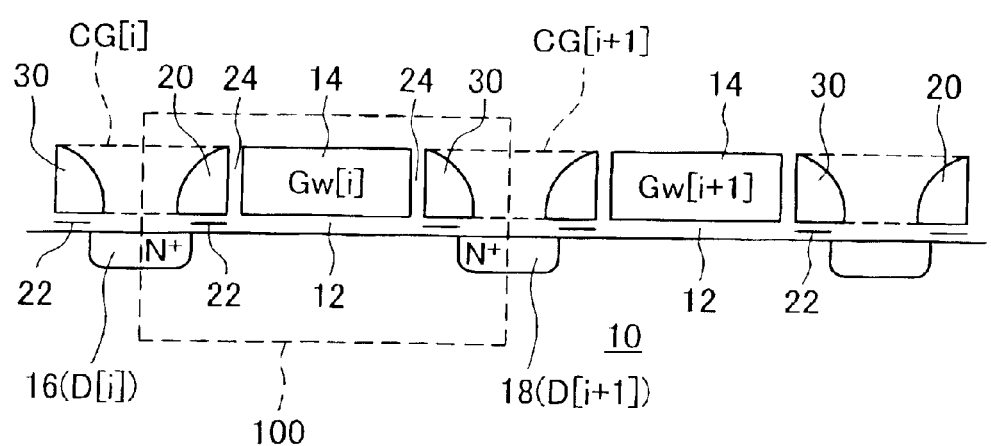
FIG. 31 is a sectional view illustrating a known MONOS memory cell.

FIGS. 30(a) and 30(b) show the state of the whole chip before and after a polishing process by the CMP technique in another manufacturing method of the semiconductor device in one modified example of the present invention. Like FIG. 29, FIG. 30 schematically illustrates the cross section of the memory area and the logic circuit area on one chip as well as the scribing area between adjoining chips. This corresponds to the part taken on the line A—A in FIG. 1. FIG. 30(a) shows the state before the polishing process, and FIG. 30(b) shows the state after the polishing process.

Formation of a patterned gate layer 140e as a dummy circuit in the scribing area 3000 between adjoining chips 900 newly causes a protrusion on the top surface of the insulating layer 270 above the gate layer 140e in the scribing area 3000 as shown in FIG. 30(a), in the process of forming the insulating layer 270 over the whole surface of the semiconductor substrate 10.

The insulating layer 270 is subsequently polished by the CMP technique. The presence of the new protrusion on the top surface of the insulating layer 270 in the scribing area 3000 between adjoining chips 900 effectively reduces the polishing rate and thereby decreases the polishing degree in the scribing area 3000 as shown in FIG. 30(b).

This arrangement effectively prevents the part of the chip 900 close to the scribing area 3000, that is, the peripheral portion of the chip 900, from being polished excessively.

In the embodiment and the modified example discussed above, the shape of the patterned gate layer 140d or 140e formed as the dummy circuit is not specifically described. The gate layer 140d or 140e may be an integral element, such as a guard ring, to continuously surround each chip 900. The gate layer 140d or 140e may otherwise include separate elements formed at preset intervals around each chip 900. Double, triple, or any other multiple gate layers 140d or 140e may be formed to surround each chip 900.

In the method of the embodiment or the method of the modified example, the patterned gate layer 140d or 140e as the dummy circuit is formed simultaneously with the patterned gate layer 140a in the memory area 1000. The technique of the present invention is, however, not restricted to this arrangement. The patterned gate layer 140d or 140e may be formed simultaneously with the gate electrodes 142 in the logic circuit area 2000. The patterned gate layer 140d or 140e may otherwise be formed independently of formation of the gate layers 140a in the memory area 1000 or formation of the gate electrodes 142 in the logic circuit area 2000.

In the embodiment discussed above, the processes (2) through (5) form the gate layers 140a and the control gates 20 and 30 in the memory area 1000, and the subsequent processes (6) through (9) form the gate electrodes 142 and the side wall insulating layers 152 in the logic circuit area 2000. The technique of the present invention is, however, not limited to this order of operations. The process may inversely form the gate electrodes 142 and the side wall insulating layers 152 in the logic circuit area 2000, prior to formation of the gate layers 140a and the control gates 20 and 30 in the memory area 1000.

The scope and spirit of the present invention are indicated by the appended claims, rather than by the foregoing description.

What is claimed is:

1. A method of manufacturing a semiconductor device, which comprises a memory area having a non-volatile memory device and a logic circuit area including a peripheral circuit of the non-volatile memory device formed on a chip, the manufacturing method comprising the steps of:
   (a) providing a semiconductor substrate, which includes a semiconductor layer, a first insulating layer formed on the semiconductor layer, a first conductive layer formed on the first insulating layer, and a stopper layer formed on the first conductive layer;
   (b) patterning the stopper layer and the first conductive layer in the memory area on the chip;
   (c) forming control gates as side walls on both side faces of the patterned first conductive layer via an oxide nitride oxide (ONO) membrane in the memory area on the chip;
   (d) etching out the stopper layer in the logic circuit area on the chip;
   (e) patterning the first conductive layer in the logic circuit area on the chip to form a gate electrode of an insulated gate field effect transistor;
   (f) forming a second insulating layer over whole surface of the semiconductor substrate; and
   (g) polishing the second insulating layer to expose the stopper layer in the memory area,
   the manufacturing method further comprising the step of:
   (h) patterning at least the first conductive layer on a peripheral portion of the chip or in a scribing area between adjoining chips to form a gate layer as a dummy circuit,
   wherein the step (h) is carried out prior to the step (f).

2. A manufacturing method in accordance with claim 1, wherein the step (b) comprises the step (h).

3. A manufacturing method in accordance with claim 1, wherein the step (e) comprises the step (h).

4. A manufacturing method in accordance with claim 1, wherein the step (c) comprises the sub-steps of:
   (c-1) forming the ONO membrane in at least the memory area;
   (c-2) forming a second conductive layer on the ONO membrane; and
   (c-3) etching the second conductive layer to form the control gates of the second conductive layer via the ONO membrane on both the side faces of the patterned first conductive layer in the memory area.

5. A manufacturing method in accordance with claim 2, wherein the step (c) comprises the sub-steps of:
   (c-1) forming the ONO membrane in at least the memory area;
   (c-2) forming a second conductive layer on the ONO membrane; and
   (c-3) etching the second conductive layer to form the control gates of the second conductive layer via the ONO membrane on both the side faces of the patterned first conductive layer in the memory area.

6. A manufacturing method in accordance with claim 3, wherein the step (c) comprises the sub-steps of:
   (c-1) forming the ONO membrane in at least the memory area;
   (c-2) forming a second conductive layer on the ONO membrane; and
   (c-3) etching the second conductive layer to form the control gates of the second conductive layer via the ONO membrane on both the side faces of the patterned first conductive layer in the memory area.

7. A manufacturing method in accordance with claim 1, wherein the step (g) applies chemical mechanical polishing (CMP) technique to polish the second insulating layer.

8. A manufacturing method in accordance with claim 2, wherein the step (g) applies chemical mechanical polishing (CMP) technique to polish the second insulating layer.

9. A manufacturing method in accordance with claim 3, wherein the step (g) applies chemical mechanical polishing (CMP) technique to polish the second insulating layer.

10. A manufacturing method in accordance with claim 4, wherein the step (g) applies chemical mechanical polishing (CMP) technique to polish the second insulating layer.

* * * * *